(12) United States Patent
Cho et al.

(10) Patent No.: US 12,740,259 B2
(45) Date of Patent: Sep. 15, 2026

(54) DISPLAY DEVICE

(71) Applicant: Samsung Display Co., LTD., Yongin-si (KR)

(72) Inventors: Young Min Cho, Seongnam-si (KR); Hong Am Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 763 days.

(21) Appl. No.: 17/577,920

(22) Filed: Jan. 18, 2022

(65) Prior Publication Data

US 2022/0231110 A1 Jul. 21, 2022

(30) Foreign Application Priority Data

Jan. 19, 2021 (KR) ........................ 10-2021-0007117

(51) Int. Cl.
*H10K 59/131* (2023.01)
*H10K 59/80* (2023.01)

(52) U.S. Cl.
CPC ....... *H10K 59/131* (2023.02); *H10K 59/8722* (2023.02)

(58) Field of Classification Search
CPC .. H10K 59/131; H10K 59/8722; H05K 1/147; H05K 3/361; H05K 3/323; H01L 27/3244
USPC ........................................................... 257/40
See application file for complete search history.

(56) References Cited

U.S. PATENT DOCUMENTS 10,224,503 B2 3/2019 Kim et al.
10,446,789 B2 10/2019 Kim et al.
10,707,280 B2 * 7/2020 Jeong ................ H10K 59/8731
10,854,843 B2 12/2020 Gwon et al.
11,160,176 B2 10/2021 Kang et al.
(Continued)

FOREIGN PATENT DOCUMENTS

CN 107644889 A 1/2018
CN 109728041 B 5/2023
(Continued)

OTHER PUBLICATIONS

KR-20190024326—English Translation (12 pages) (Year: 2019).*
(Continued)

*Primary Examiner* — Toan Ton
(74) *Attorney, Agent, or Firm* — F. CHAU & ASSOCIATES, LLC

(57) ABSTRACT

A display device includes a display panel including a display panel pad and a dam structure, a driving film attached to the display panel and including a driving film board, a connection lead disposed on a rear surface of the driving film board and facing the display panel pad, a first signal line electrically connected to the connection lead, and a protection member overlapping at least one of the connection lead and the first signal line, and a conductive adhesive member disposed between the display panel and the driving film and electrically connecting the display panel pad with the connection lead. The display panel pad and the dam structure are disposed on an upper surface of the display panel, the dam structure is disposed more to an outside of the display panel than the display panel pad, and the protection member of the driving film overlaps the dam structure.

23 Claims, 15 Drawing Sheets

(56) References Cited

U.S. PATENT DOCUMENTS

| | | | | |
|---|---|---|---|---|
| 11,307,695 | B2 | 4/2022 | Gwon et al. | |
| 11,656,709 | B2 | 5/2023 | Gwon et al. | |
| 2015/0319849 | A1 | 11/2015 | Shimizu et al. | |
| 2020/0084899 | A1* | 3/2020 | Kang | H05K 5/0069 |
| 2020/0135835 | A1* | 4/2020 | Seo | H10K 59/8731 |

FOREIGN PATENT DOCUMENTS

| | | | | |
|---|---|---|---|---|
| KR | 10-2001-0019260 | A | | 3/2001 |
| KR | 10-2012-0122943 | | | 11/2012 |
| KR | 10-2016-0043190 | A | | 4/2016 |
| KR | 10-1853032 | | | 6/2018 |
| KR | 10-2019-0024326 | | | 3/2019 |
| KR | 20190024326 | A | * | 6/2019 |
| KR | 10-2020-0017331 | | | 2/2020 |
| KR | 10-2020-0029683 | A | | 3/2020 |
| WO | WO2014092035 | A1 | | 6/2014 |

OTHER PUBLICATIONS

Office Action dated Mar. 26, 2025 in corresponding Korean Patent Application No. 10-2021-0007117 (11 pages—in Korean).

Office Action dated Jul. 23, 2025 in corresponding Chinese Patent Application No. 202210049252.8 (6 pages—in Chinese).

* cited by examiner

DISPLAY DEVICE

CROSS-REFERENCE TO RELATED APPLICATION(S)

This application claims priority to and the benefit of Korean Patent Application No. 10-2021-0007117 under 35 U.S.C. 119, filed on Jan. 19, 2021, in the Korean Intellectual Property Office (KIPO), the entire contents of which are incorporated herein by reference.

BACKGROUND

1. Technical Field

The disclosure relates to a display device.

2. Description of Related Art

As the information-oriented society evolves, various demands for display devices are ever increasing. For example, display devices are being employed by a variety of electronic devices such as smart phones, digital cameras, laptop computers, navigation devices, and smart televisions.

The display device includes: a light-receiving display device such as a liquid-crystal display device, a field emission display device, and a light-emitting display device; an organic light-emitting display device including an organic light-emitting element; an inorganic light-emitting display device including an inorganic light-emitting element such as an inorganic semiconductor; and a light-emitting display device such as a micro-light-emitting display device including a micro-light-emitting element.

A display device includes pads and alignment marks. A flexible film (COF film) having a driving circuit and the like mounted thereon is electrically coupled or connected to the pads, to transmit driving signals to pixels. The flexible film may include leads coupled with the pads. The leads may be bonded to the pads separated from one another.

SUMMARY

Aspects of the disclosure provide a display device with improved reliability by way of preventing corrosion of pads of a display panel and leads of a printed circuit film to suppress or prevent contact failure between the pads of the display panel and the leads of the printed circuit film.

It should be noted that objects of the disclosure are not limited to the above-mentioned object; and other objects of the disclosure will be apparent to those skilled in the art from the following descriptions.

An embodiment of a display device may include a display panel including at least one display panel pad and a dam structure, a driving film attached to the display panel and including a driving film board, a connection lead disposed on a rear surface of the driving film board and facing the at least one display panel pad, a first signal line electrically connected to the connection lead, and a protection member overlapping with at least one of the connection lead and the first signal line, and a conductive adhesive member disposed between the display panel and the driving film and electrically connecting the at least one display panel pad with the connection lead. The at least one display panel pad and the dam structure may be disposed on an upper surface of the display panel, the dam structure may be disposed more to an outside of the display panel than the display panel pad, and the protection member of the driving film may overlap the dam structure.

The display panel may include a main region; a bending region extended from an end of the main region and bendable in a direction; and a sub-region extended from an end of the bending region and overlapping the main region, the at least one display panel pad and the dam structure are disposed in the sub-region, and the driving film may be attached to the sub-region.

The driving film may include an overlapping area that overlaps the sub-region of the display panel; and a non-overlapping area that does not overlap the sub-region of the display panel. The protection member of the driving film may be disposed across the overlapping area and the non-overlapping area.

The connection lead and the first signal line may overlap at least one of the protection member and the conductive adhesive member over the entire area.

The dam structure may have an island shape in a plan view.

The dam structure and the at least one display panel pad may be disposed on a same layer.

The dam structure may have a thickness in a range of about 0.1 μm to about 10 μm.

The conductive adhesive member may be at least partially disposed between the dam structure and the protection member.

The conductive adhesive member may be a conductive anisotropic film comprising an adhesive layer and conductive balls.

The dam structure and the protection member may be spaced apart from each other in a thickness direction of the display device, and a diameter of the conductive balls may be greater than a distance between the dam structure and the protection member.

The at least one display panel pad may include a plurality of display panel pads, the dam structure may include a pattern of dams spaced apart from one another, and the plurality of display panel pads and the dams of the pattern may be arranged in a first direction.

The at least one display panel pads may be aligned with the dams of the pattern, respectively, in a second direction intersecting and the first direction.

The dam structure may include a first dam area extended in a first direction and located on a side of the at least one display panel pad in a second direction; and a second dam area extended in the second direction from at least one of an end and another end of the first dam area in the first direction and located on at least of a side and another side of the at least one display panel pad in the first direction. The first direction and the second direction may intersect each other.

The dam structure directly may contact the protection member of the driving film.

The dam structure may be extended in a first direction, the conductive adhesive member may be disposed on a side and another side of the dam structure in a second direction, and the first direction and the second direction may intersect each other.

The conductive adhesive member may overlap an entire area of the dam structure.

The display device may further include a cover film disposed on a rear surface of the display panel; and an adhesive member disposed between the display panel and the cover film.

An embodiment of a display device may include a display panel including a display panel pad and a dam structure having an island shape in a plan view, a driving film attached to the display panel, the driving film including a driving film board, a connection lead disposed on a rear surface of the driving film board that faces an upper surface of the display panel to face the display panel pad, a first signal line electrically connected to the connection lead, and a protection member overlapping at least one of the connection lead and the first signal line, and a conductive adhesive member disposed between the display panel and the driving film and electrically connecting the display panel pad with the connection lead. The display panel pad and the dam structure may be disposed on the upper surface of the display panel, and the dam structure may be disposed more to an outside of the display panel than the display panel pad.

The protection member of the driving film and the dam structure may face and overlap each other, and the conductive adhesive member may be disposed between the protection member of the driving film and the dam structure.

The display panel may include a main region; a bending region extended from an end of the main region and bendable in a direction; and a sub-region extended from an end of the bending region and overlapping the main region, the display panel pad and the dam structure may be disposed in the sub-region, and the driving film may be attached to the sub-region.

An embodiment of a display device may include a display panel including a main region, a bending region extended from an end of the main region and bendable in a direction, a sub-region extended from an end of the bending region and overlapping the main region, a plurality of display panel pads arranged in a first direction in the sub-region of the display panel, and a dam structure extended in the first direction in the sub-region of the display panel and disposed more to an outside of the display panel than the plurality of display panel pads, a driving film attached to the sub-region of the display panel, the driving film including a driving film board, a plurality of connection leads disposed on the driving film board and overlapping the plurality of display panel pads, respectively, a plurality of first signal lines electrically connected to the plurality of connection leads, respectively, and a protection member disposed on the driving film board and overlapping at least one of the plurality of connection leads and the plurality of first signal lines, and a conductive adhesive member disposed between the display panels and the driving film and electrically connecting the plurality of display panel pads with the plurality of connection leads. The driving film may further include an overlapping area that overlaps the sub-region of the display panel, and a non-overlapping area that does not overlap the sub-region of the display panel, and the protection member of the driving film may be disposed across the overlapping area and the non-overlapping area.

The protection member of the driving film may overlap the dam structure.

The conductive adhesive member may be disposed between the protection member and the dam structure where the protection member and the dam structure overlap each other.

The dam structure may have an island shape in a plan view.

According to an embodiment of the disclosure, the reliability of a display device can be improved by way of preventing corrosion of pads of a display panel and leads of a printed circuit film to suppress or prevent contact failure between the pads of the display panel and the leads of the printed circuit film.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 2 is a schematic side view illustrating a part of a display device according to an embodiment of the disclosure.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first," "second," and the like may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 1:
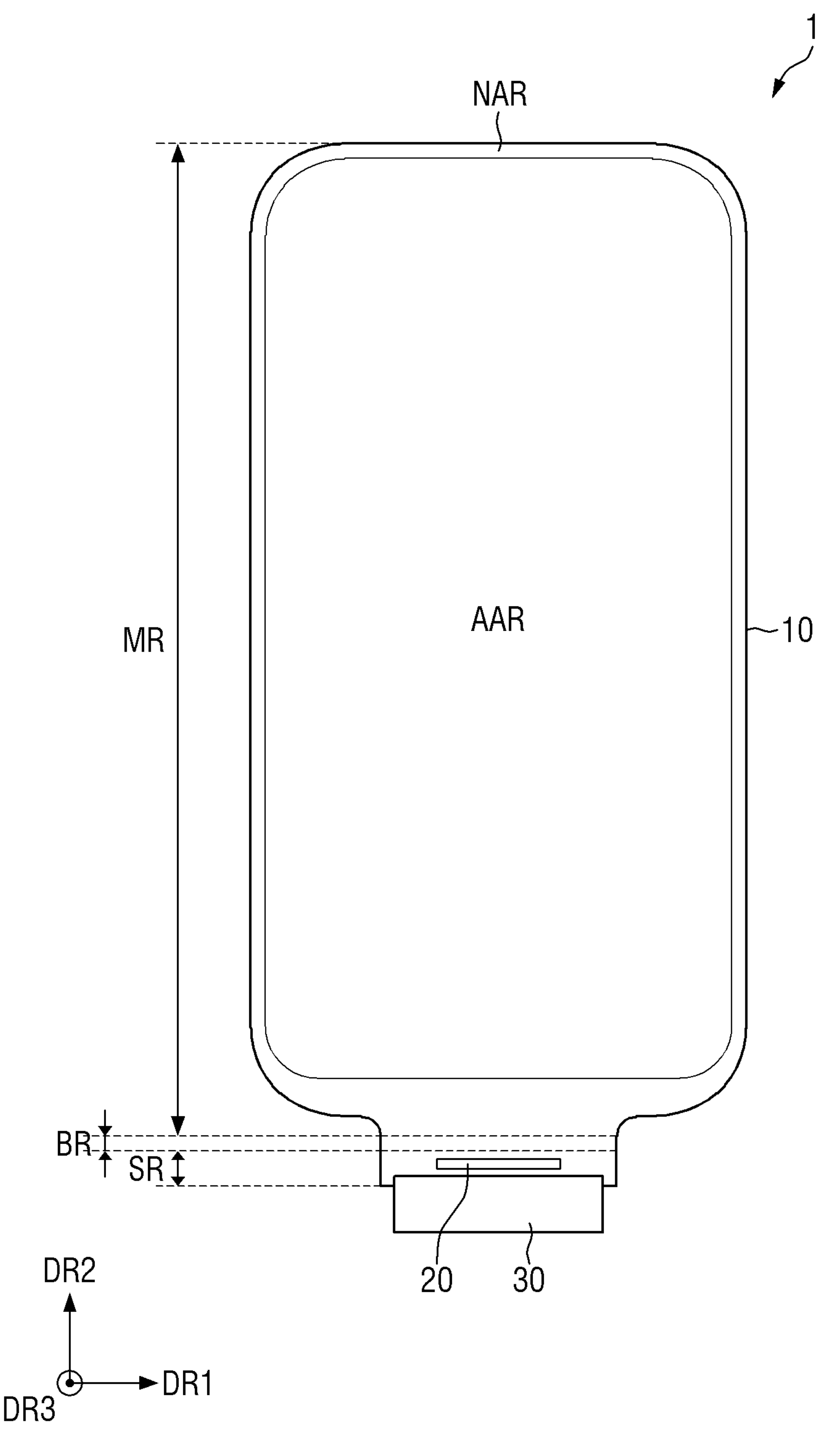
FIG. 1 is a schematic plan view illustrating the layout of a display device according to an embodiment of the disclosure.
Figure 2:
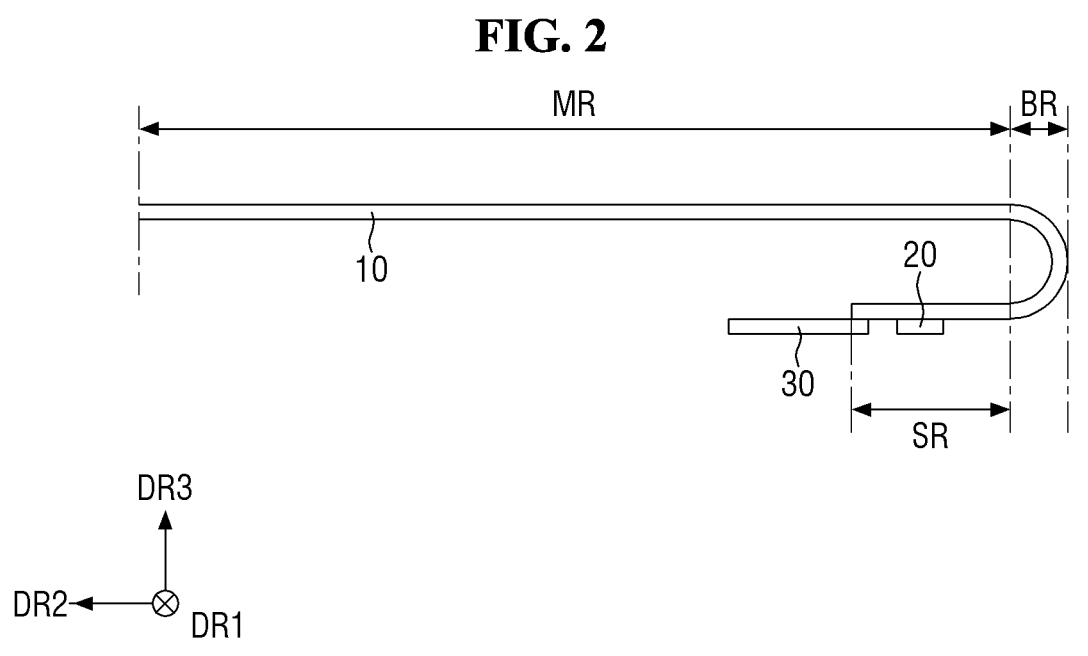

FIG. 1 is a schematic plan view illustrating the layout of a display device according to an embodiment. FIG. 2 is a schematic side view illustrating a part of a display device according to an embodiment. FIG. 1 illustrates a display panel 10 in case that it is not bent. FIG. 2 illustrates the display panel 10 in case that it is bent.

Referring to FIGS. 1 and 2, a first direction DR1 and a second direction DR2 are different directions and intersect each other. In the plan view of FIG. 1, the first direction DR1 is defined as a horizontal direction, and the second direction DR2 is defined as a vertical direction for convenience of illustration. In the following description, a first side in the first direction DR1 indicates a right side, a second side in the first direction DR1 indicates a left side, a first side in the second direction DR2 indicates an upper side, and a second side in the second direction DR2 indicates a lower side in a plan view.

A third direction DR3 refers to a direction that intersects a plane defined by the first direction DR1 and the second direction DR2, and the third direction DR3 is perpendicular to both the first direction DR1 and the second direction DR2. It should be understood that the directions referred to in the embodiments are relative directions, and the embodiments are not limited to the directions mentioned.

As used herein, the terms "top," "upper surface," and "upper side" in the third direction DR3 refer to a display surface of a display panel 10, whereas the terms "bottom," "lower surface," and "lower side" refer to the opposite side of the display panel 10, unless stated otherwise.

A display device 1 may refer to any electronic device that provides a display screen. The display device 1 may include portable electronic devices for providing a display screen, such as a mobile phone, a smart phone, a tablet personal computer (PC), an electronic watch, a smartwatch, a watch-phone, a mobile communications terminal, an electronic notebook, an electronic book, a portable multimedia player (PMP), a navigation device, a game console, and a digital camera, as well as a television, a laptop computer, a monitor, an electronic billboard, and an Internet of Things devices, etc.

The display device 1 includes an active area AAR and a non-active area NAR. In the display device 1, a display area may be defined as the area where images are displayed, a non-display area may be defined as the area where no image is displayed, and a touch area may be defined as an area where a touch input is sensed. The display area and the touch area may be included in the active area AAR. The display area and the touch area may overlap each other. For example, in the active area AAR, images may be displayed, and a touch input may be sensed.

The shape of the active area AAR may be a rectangle or a rectangle with rounded corners. For example, the shape of the active area AAR is a rectangle that has rounded corners and has sides in the second direction DR2 longer than sides in the first direction DR1. It is, however, to be understood that the disclosure is not limited thereto. The active area AAR may have various shapes such as a rectangular shape with sides in the first direction DR1 longer than sides in the second direction DR2, a square shape, other polygonal shapes, a circular shape, and an elliptical shape.

The non-active area NAR is disposed around the active area AAR. The non-active area NAR may be a bezel area. The non-active area NAR may surround all sides (four sides in the drawings) of the active area AAR. It is, however, to be understood that the disclosure is not limited thereto. For example, the non-active area NAR may not be disposed near the upper side of the active region AAR or near the left or right side thereof.

In the non-active area NAR, signal lines for applying signals to the active area AAR (display area or touch area) or driving circuits may be disposed. The non-active area NAR may include no display area. Further, the non-active area NAR may include no touch area. In another embodiment, the non-active area NAR may include a part of the touch area, and a sensor member such as a pressure sensor may be disposed in that part. In some embodiments, the active area AAR may be completely identical to the display area where images are displayed, while the non-active area NAR may be completely identical to the non-display area where no image is displayed.

The display device 1 includes a display panel 10 for providing a display screen. Examples of the display panel 10 may include an organic light-emitting display panel, a micro LED display panel, a nano LED display panel, a quantum-dot light-emitting display panel, a liquid-crystal display panel, a plasma display panel, a field emission display panel, an electrophoretic display panel, an electrowetting display panel, etc. In the following description, an organic light-emitting display panel is employed as an example of the display panel 10, but the disclosure is not limited thereto. Any other display panel may be employed as long as the technical idea of the present disclosure can be equally applied.

The display panel 10 may include pixels. The pixels may be arranged in a matrix. The shape of each pixel may be, but is not limited to, a rectangle or a square in a plan view. Each pixel may have a diamond or rhombic shape having sides inclined with respect to the first direction DR1 or the second direction DR2. Each pixel may include an emission area. Each emission area and the pixels may have the same shape or different shapes. For example, in case that the pixels have a rectangular shape, the shape of the emission area of each of the pixels may have various shapes such as a rectangle, a rhombus, a hexagon, an octagon, and a circle. The pixels and the emission areas will be described in detail below.

The display device 1 may further include a touch member for sensing a touch input. The touch member may be implemented as a panel or film separated from the display panel 10 and may be attached on the display panel 10 or may be implemented in the form of a touch layer inside the display panel 10. In the following description, although the touch member is provided inside the touch panel and included in the display panel 10 in the form of the touch layer, the disclosure is not limited thereto.

The display panel 10 may include a flexible substrate including a flexible polymer material such as polyimide. Accordingly, the display panel 10 may be curved, bent, folded, or rolled.

The display panel 10 may further include a main region MR, a bending region BR, and a sub-region SR. The bending region BR may include a part of the display panel 10 that is bendable. In other words, the display panel 10 may be bent in the bending region BR. The main region MR may be located on a first side of the bending region BR in the second direction DR2 while the sub-region SR may be located on a second side of the bending region BR in the second direction DR2.

The active area AAR is disposed in the main region MR. According to an embodiment, the edge portions of the active area AAR in the main region MR, the entire bending region BR, and the entire sub-region SR may be the non-active area NAR. It is, however, to be understood that the disclosure is not limited thereto. The bending region BR and/or the sub-region SR may also include the active area AAR.

The main region MR may have a shape generally similar to the exterior of the display device 1 in a plan view. The main region MR may be a flat region located in a plane. It is, however, to be understood that the disclosure is not limited thereto. At least one of the edges of the main region MR except for the edge (side) connected or extended to the bending region BR may be bent to form a curved surface or may be bent at a right angle.

In case that at least one of the edges of the main region MR except for the edge (side) thereof connected or extended to the bending region BR is curved or bent, the display area may also be disposed at the edge. It is, however, to be understood that the disclosure is not limited thereto. The curved or bent edge may be the non-display area that does not display image, or the display area and the non-display area may be disposed together.

The bending region BR is connected or extended to the second side of the main region MR in the second direction DR2. For example, the bending region BR may be connected or extended to the lower short side of the main region MR. The width of the bending region BR may be less than the width (the width of the shorter side) of the main region MR. Portions where the main region MR meets the bending region BR may be cut in an L-shape.

In the bending region BR, the display panel 10 may be bent downward in the thickness direction, for example, in the direction away from the display surface with a curvature. Although the bending region BR may have a constant radius of curvature, the disclosure is not limited thereto. It may have different radii of curvature for difference sections. As the display panel 10 is bent in the bending region BR, the surface of the display panel 10 may be reversed. Specifically, the surface of the display panel 10 facing upward may be bent such that it faces outward in the bending region BR and faces downward.

The sub-region SR is extended from the bending region BR. The sub-region SR may be extended from the end of the bending region BR in a direction parallel to the main region MR. The sub-region SR may overlap the main region MR in the thickness direction of the display panel 10. The width of the sub-region SR (the width in the first direction DR1) may be equal to the width of the bending region BR but is not limited thereto.

A driver chip 20 may be disposed in the sub-region SR. The driving chip 20 may employ, for example, chip on film (COF) packaging. The driving chip 20 may include an integrated circuit for driving the display panel 10. The integrated circuit may include an integrated circuit for a display and/or an integrated circuit for a touch part. The integrated circuit for a display and the integrated circuit for a touch part may be provided as separate chips or may be integrated into a single chip.

A pad part and a dam structure may be disposed at the end of the sub-region SR of the display panel 10. The dam structure may be disposed more to the outside of the display panel 10 than the pad part. Detailed descriptions thereof will be given below.

A driving film 30 may be electrically connected to the pad part at the end of the sub-region SR of the display panel 10. The driving film 30 may be a flexible printed circuit board or a flexible printed circuit film. The driving film 30 may be an integrated driving film that drives the display as well as the touch member. It is, however, to be understood that the disclosure is not limited thereto. A film for driving the display and a film for driving the touch member may be provided separately. The driving film 30 may be attached thereto by an adhesive member ACF (see FIG. 6).

Figure 3:
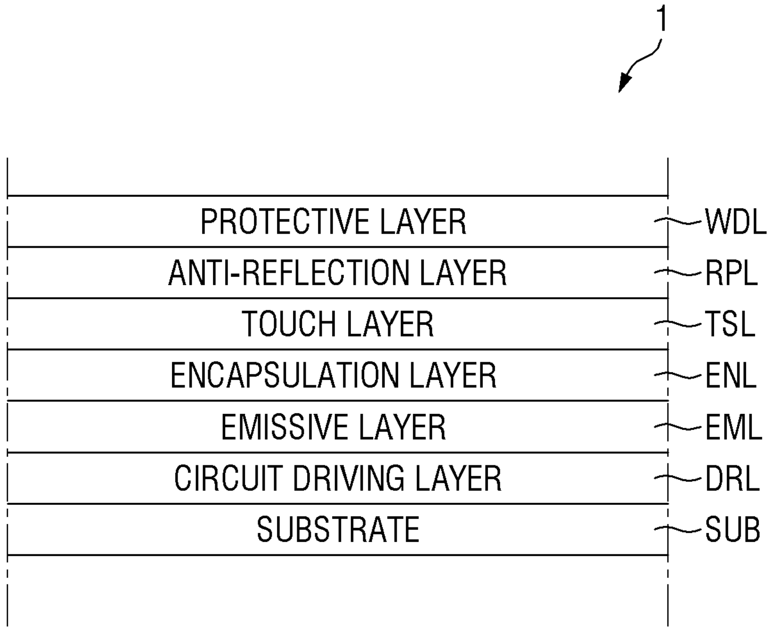
FIG. 3 is a schematic cross-sectional view illustrating an example of a stack structure of a display device according to an embodiment of the disclosure.

FIG. 3 is a schematic cross-sectional view illustrating an example of a stack structure of a display device according to an embodiment.

Referring to FIG. 3, the display device 1 may include a substrate SUB, a circuit-driving layer DRL, an emissive layer EML, an encapsulation layer ENL, a touch layer TSL, an anti-reflection layer RPL, and a protective layer WDL, which are stacked on one another.

The substrate SUB may support elements disposed thereon.

The circuit-driving layer DRL may be disposed on the substrate SUB. The circuit-driving layer DRL may include a circuit for driving an emissive layer EML of each pixel. The circuit-driving layer DRL may include thin-film transistors.

The emissive layer EML may be disposed on the circuit-driving layer DRL. The emissive layer EML may include an organic emitting layer. The emissive layer EML may emit light with various luminances depending on driving signals transmitted from the circuit-driving layer DRL.

The encapsulation layer ENL may be disposed on the emissive layer EML. The encapsulation layer ENL may include an inorganic film or a stack of an inorganic film and an organic film. As another example, glass or an encapsulation film may be employed as the encapsulation layer ENL.

The touch layer TSL may be disposed on the encapsulation layer ENL. The touch layer TSL may sense a touch input and may perform the functions of the touch member. The touch layer TSL may include sensing regions and sensing electrodes.

In case that the touch layer TSL is included in the display panel 10 (see FIG. 1), the display panel 10 (see FIG. 1) may include a substrate SUB, a circuit-driving layer DRL, an emissive layer EML, an encapsulation layer ENL, and the touch layer TSL. It is, however, to be understood that the disclosure is not limited thereto.

The anti-reflection layer RPL may be disposed on the touch layer TSL. The anti-reflection layer RPL may reduce reflection of external light. The anti-reflection layer RPL may be attached in the form of a polarizing film. In this case, the anti-reflection layer RPL may polarize the light passing therethrough, and the anti-reflection layer RPL may be attached to the touch layer TSL by an adhesive layer. The anti-reflection layer RPL in the form of a polarizing film may be removed. The anti-reflection layer RPL may reduce reflection of external light. It is, however, to be understood that the disclosure is not limited thereto. The anti-reflection layer RPL may be stacked in the form of a color filter layer inside the display panel 10. In this case, the anti-reflection layer RPL may include a color filter that selectively transmits light of a particular wavelength, etc.

The protective layer WDL may be disposed on the anti-reflection layer RPL. The protective layer WDL may include, for example, a window member. The protective layer WDL may be attached to the anti-reflection layer RPL by an optically clear adhesive or the like.

The stack structure of the display panel 10 will be described in more detail below.

Figure 4:
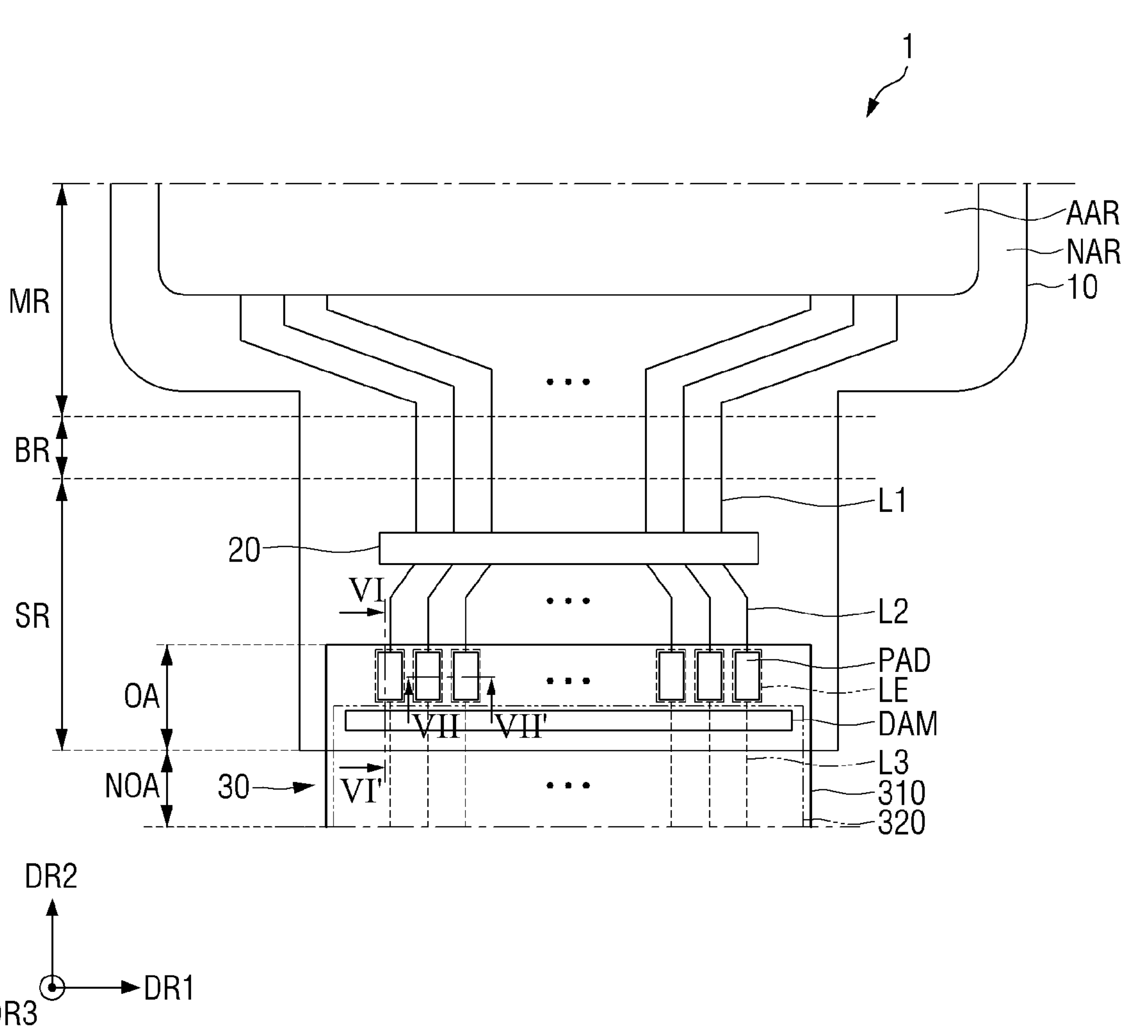
FIG. 4 is a schematic plan view illustrating a layout of a display panel and a driving film of a display device according to an embodiment.
Figure 5:
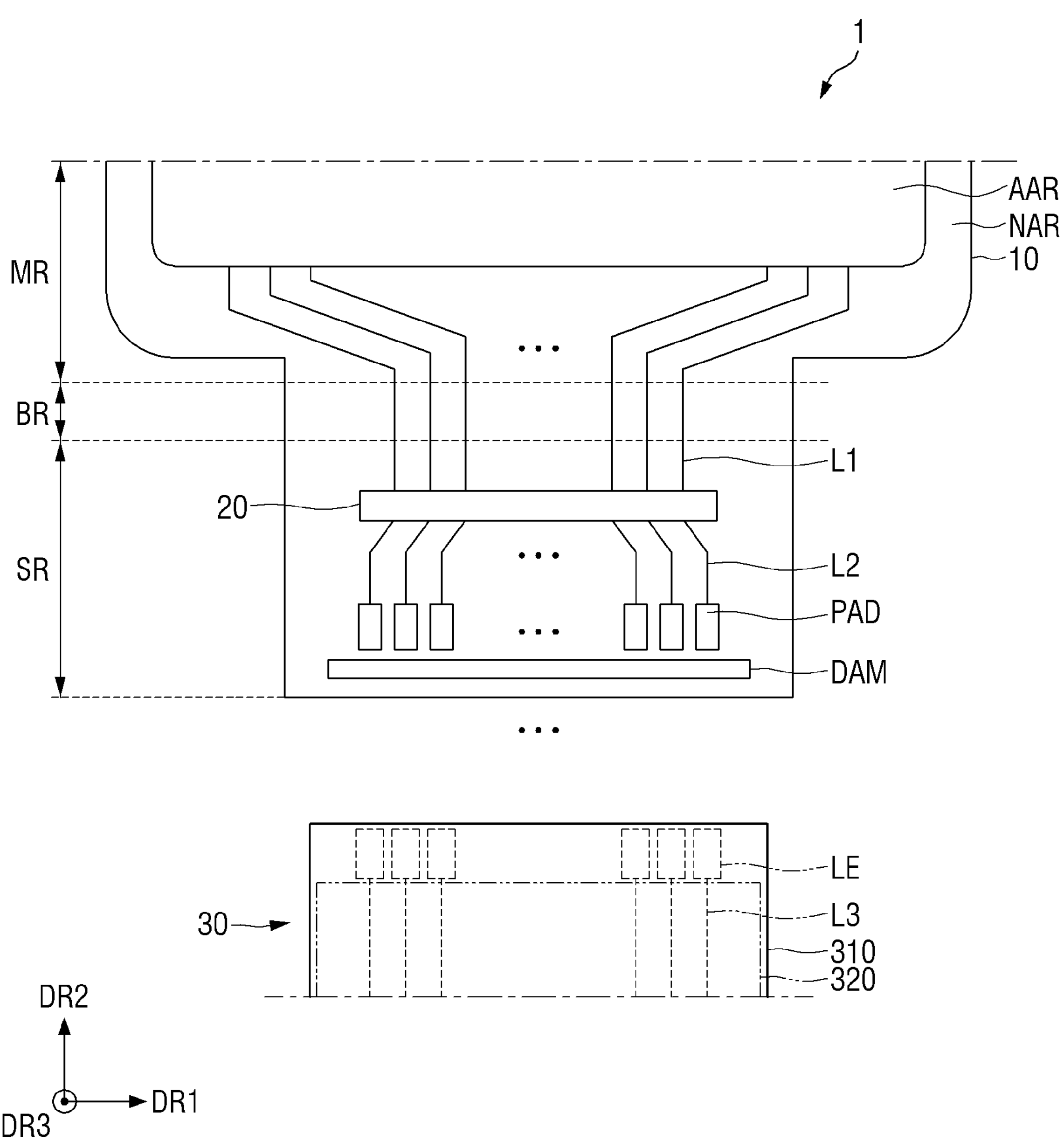
FIG. 5 is a schematic plan view illustrating the display panel and the driving film of FIG. 4, which are separated from each other.

FIG. 4 is a schematic plan view illustrating a layout of a display panel and a driving film of a display device according to an embodiment. FIG. 5 is a schematic view illustrating the display panel and the driving film of FIG. 4, which are separated from each other. FIGS. 4 and 5 illustrate the periphery of the sub-region SR of the display panel 10 in case that it is not bent.

Referring to FIGS. 4 and 5, the display panel 10 may further include a display panel pad PAD, a dam structure DAM, first signal lines L1, and second signal lines L2. The display panel pad PAD, the dam structure DAM, the first signal lines L1, and the second signal lines L2 may be disposed on the upper surface of the display panel 10. It is, however, to be understood that the disclosure is not limited thereto.

The display panel pad PAD may be disposed at the end of the sub-region SR of the display panel 10. The display panel pad PAD may be disposed on a second side of the driving chip 20 in the second direction DR2. Display panel pads PAD may be disposed, and the display panel pads PAD may be repeatedly arranged in the first direction DR1. The display panel pads PAD may include, e.g., a display signal line pad, a touch signal line pad, a power supply pad, a data pad, or a panel dummy part. The width of the display panel pad PAD (the width in the first direction DR1) may be greater than the width of the second signal line L2 (the width in the direction perpendicular to the extension direction), but the disclosure is not limited thereto.

The dam structure DAM may be disposed at the end of the sub-region SR of the display panel 10. The dam structure DAM may include, but is not limited to, an organic material. The dam structure DAM may include an inorganic material or may also include an organic material as well as an inorganic material. The dam structure DAM may include a stack of multiple layers. In this case, each of the layers of the stack may include an organic or inorganic material.

The dam structure DAM may be disposed on the outer side of the display panel pads PAD, and the dam structure DAM may be extended in the direction in which the display panel pads PAD are arranged. In other words, the dam structure DAM may be disposed more to the outside of the display panel 10 than the display panel pads PAD. The dam structure DAM is disposed on the second side of the display panel pads PAD in the second direction DR2, and the dam structure DAM may be extended in the first direction DR1. As the dam structure DAM is disposed on the outer side of the display panel pads PAD, the movement of the adhesive member ACF (see FIG. 6) can be controlled more efficiently. Detailed descriptions thereof will be given below.

The first signal lines L1 may electrically connect the pixels in the active area AAR with the driving chip 20. The first signal lines L1 may be extended from the driving chip 20 disposed in the sub-region SR to the first side in the second direction DR2 and may cross the bending region BR to be extended to the pixels of the main region MR. The first signal lines L1 may be electrically connected to the pixels and the driving chip 20. For example, the pixels in the active area AAR and the driving chip 20 may be electrically connected with each other by the first signal lines L1. The first signal lines L1 and the display panel pads PAD may be disposed on different layers, but the disclosure is not limited thereto. The first signal lines L1 and the display panel pads PAD may be disposed on the same layer.

The second signal lines L2 may electrically connect the driving chip 20 with the display panel pads PAD. The second signal lines L2 may be extended from the driving chip 20 to the second side in the second direction DR2 and may be extended to the display panel pads PAD. The second signal lines L2 may electrically connect the driving chip 20 with the display panel pads PAD. For example, the driving chip 20 and the display panel pads PAD may be electrically connected with each other by the second signal lines L2. The second signal lines L2 and the display panel pads PAD may be disposed on a same layer, but the disclosure is not limited thereto. The second signal lines L2 and the display panel pads PAD may be disposed on different layers.

The driving film 30 may further include a driving film board 310, a connection lead LE, third connection lines L3, and a protection member 320. The driving film board 310 may provide a space in which the connection lead LE and the third connection lines L3 are disposed. The connection lead LE and the third connection lines L3 may be disposed on the driving film board 310. The connection lead LE and the third connection lines L3 may be disposed on the rear surface of the driving film board 310. Herein, the rear surface may refer to the opposite surface to the front (upper) surface from which light is emitted in case that the display device 1 is a top-emission display device.

The connection lead LE may be disposed at an end of the driving film board 310 in the second direction DR2. Connection leads LE may be provided, and the connection leads LE may be repeatedly arranged in the first direction DR1. The connection leads LE may be associated with the display panel pads PAD, respectively. The connection leads LE may face the display panel pads PAD, respectively, and may overlap the display panel pads PAD, respectively. The connection leads LE may be electrically connected to the display panel pads PAD, respectively, by an adhesive member ACF (see FIG. 6). The width of the connection leads LE (the width in the first direction DR1) may be greater than the width of the third signal lines L3 (the width in the direction perpendicular to the extension direction), but the disclosure is not limited thereto.

The third signal lines L3 may be electrically connected or extended to the connection leads LE to the second side in the second direction DR2. Although not shown in the drawings, the third signal lines L3 may be electrically connected to a main processor that controls overall driving of the display device 1. The main processor may be disposed on the driving film 30, but the disclosure is not limited thereto. The main processor may also be disposed on a separate element. In this case, the separate element may be disposed on the driving film 30 to be electrically connected to the third signal lines L3.

The protection member 320 may be disposed on the third signal lines L3. The protection member 320 may be disposed on the rear surface of the driving film board 310. The protection member 320 may cover (or overlap) and protect at least one of the third signal lines L3 and the connection leads LE. For example, the protection member 320 may cover and protect the third signal lines L3 and expose at least a part of each of the connection leads LE. The protection member 320 may include an organic material coating layer such as polyimide, acrylate and epoxy. It is, however, to be understood that the disclosure is not limited thereto. The protection member 320 may be provided in the form of a protection film.

The driving film 30 may further include an overlapping area OA overlapping the sub-region SR of the display panel 10 and a non-overlapping area NOA extended from the overlapping area OA. The non-overlapping area NOA may be extended from the overlapping area OA to the outer side of the sub-region SR of the display panel 10 and may not overlap the sub-region SR. In case that the driving film 30 is attached to the sub-region SR of the display panel 10, at least a part of the display panel pads PAD, the dam structure DAM, and the connection leads LE may be disposed to overlap the overlapping area OA of the driving film 30. The third signal lines L3 may be disposed across the overlapping area OA and the non-overlapping area NOA, but the disclosure is not limited thereto.

At least a part of the protection member 320 may overlap the sub-region SR of the display panel 10. In other words, the protection member 320 may be disposed on the driving film 30 across the overlapping area OA and the non-overlapping area NOA. The protection member 320 may overlap the third signal lines L3 and the connection leads LE that do not overlap the conductive adhesive member ACF (see FIG. 6). In other words, the protection member 320 may cover and protect the third signal lines L3 and the connection leads LE that are not covered by the conductive adhesive member ACF (see FIG. 6).

The protection member 320 may overlap the dam structure DAM. The protection member 320 may overlap the dam structure DAM and may be disposed across the first side and the second side of the dam structure DAM in the second direction DR2. Accordingly, the display device 1 requires no additional moisture-proof member. The display device 1 can suppress or prevent corrosion of the third signal lines L3 and the connection leads LE even without any moisture-proof member.

Figure 6:
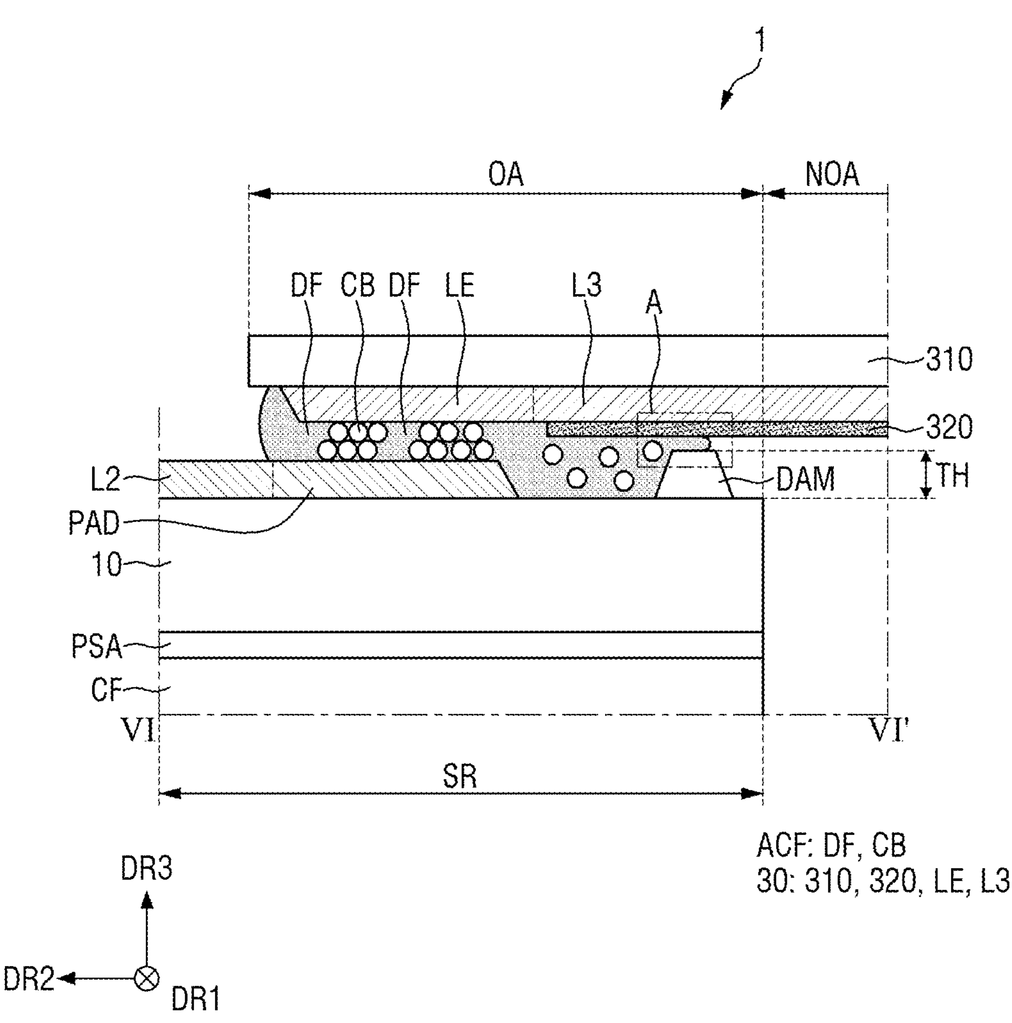
FIG. 6 is a schematic cross-sectional view taken along line VI-VI' of FIG. 4.
Figure 7:
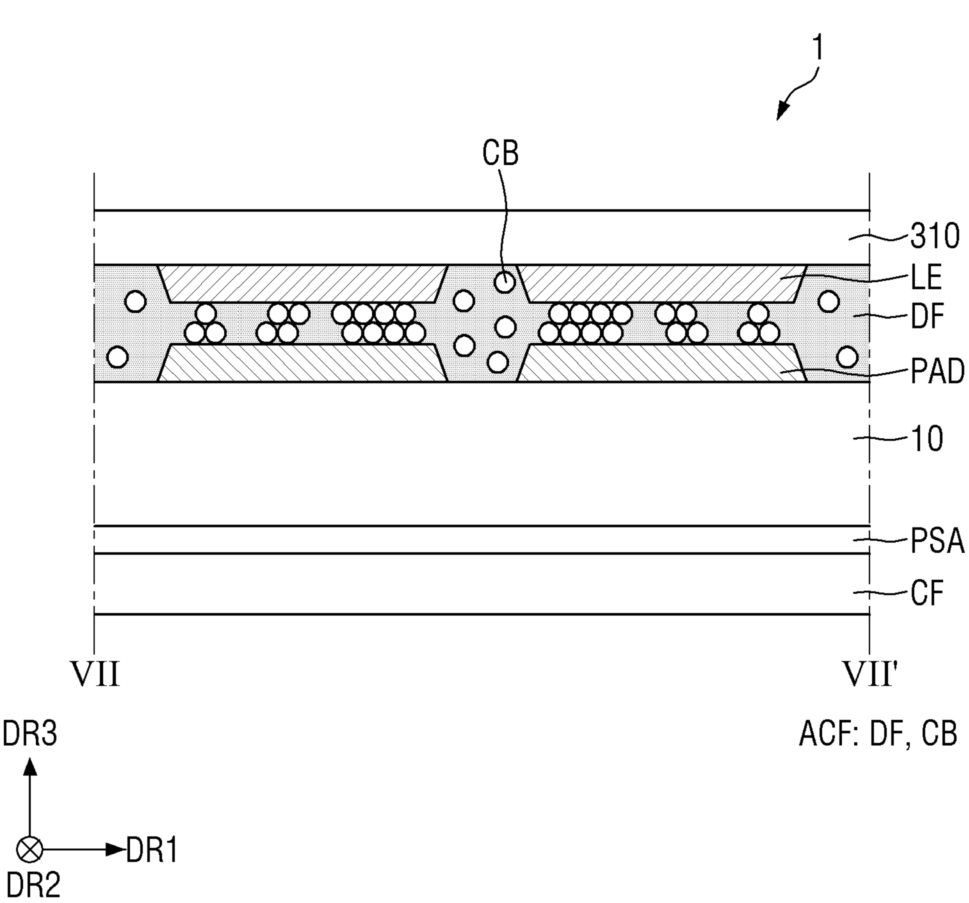
FIG. 7 is a schematic cross-sectional view taken along line VII-VII' of FIG. 4.
Figure 8:
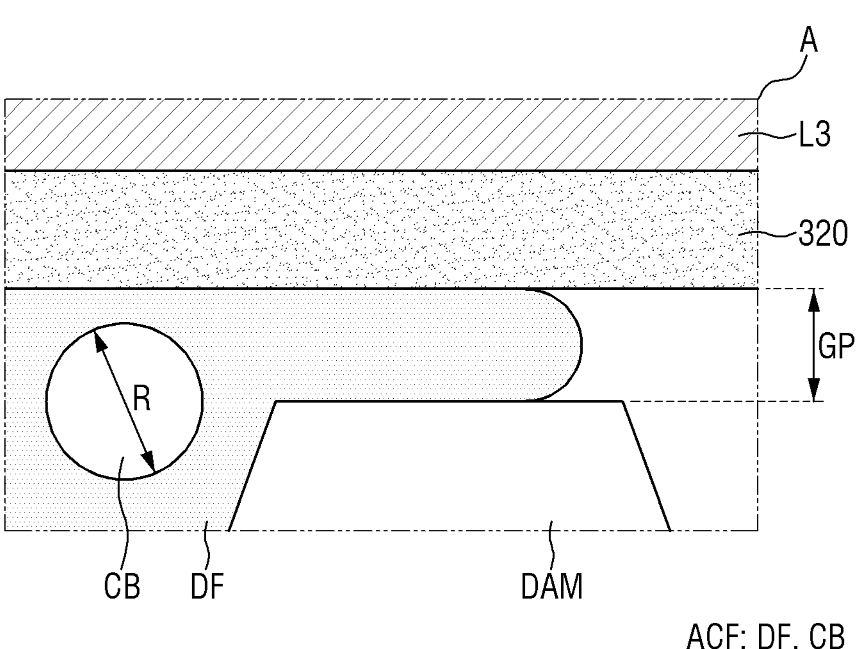
FIG. 8 is a schematic enlarged view of area A of FIG. 6.

FIG. 6 is a schematic cross-sectional view taken along line VI-VI' of FIG. 4. FIG. 7 is a schematic cross-sectional view taken along line VII-VII' of FIG. 4. FIG. 8 is a schematic enlarged view of area A of FIG. 6.

Referring to FIGS. 6 to 8, the display device 1 may further include a cover film CF, an adhesive member PSA, and a conductive adhesive member ACF.

The cover film CF may be disposed on the rear surface of the display panel 10. In case that the display panel 10 is not bent, the cover film CF may be disposed under the display panel 10. The cover film CF can block outside air and moisture that may penetrate from below the display panel 10, and can support the display panel 10.

The cover film CF may be disposed on the entire area of the display panel 10. In this case, as the display panel 10 is bent, the cover film CF may also be bent. It is, however, to be understood that the disclosure is not limited thereto. The cover film CF may be disposed only in the main region MR (see FIG. 1) of the display panel 10 and accordingly may not be bent even in case that the display panel 10 is bent. The cover film CF may be made of (or include), for example, a material including polyethylene terephthalate (PET), polyimide (PI), polycarbonate (PC), polyethylene (PE), polypropylene (PP), polysulfone (PSF), polymethylmethacrylate (PMMA), triacetyl cellulose (TAC), cycloolefin polymer (COP), etc.

The adhesive member PSA may be disposed between the display panel 10 and the cover film CF to attach the display panel 10 to the cover film CF. The adhesive member PSA may include, but is not limited to, a pressure sensitive adhesive or an adhesive.

The conductive adhesive member ACF may be disposed in an area where the display panel 10 and the driving film 30 overlap each other. The conductive adhesive member ACF may be interposed between the display panel 10 and the driving film 30 in an area where the display panel 10 and the driving film 30 overlap each other. The display panel 10 and the driving film 30 may be attached together by the conductive adhesive member ACF. The display panel pads PAD and the connection leads LE may be electrically connected by the conductive adhesive member ACF. Although the disclosure is not limited thereto, the conductive adhesive member ACF may be, for example, an anisotropic conductive film. In case that the adhesive member ACF is an anisotropic conductive film, the display panel 10 and the driving film 30 may be attached together by applying heat or pressing them.

In case that the conductive adhesive member ACF is an anisotropic conductive film, the conductive adhesive member ACF may include an adhesive layer DF and conductive balls CB. The adhesive layer DF may attach the display panel 10 to the driving film 30. The adhesive layer DF may cover (or overlap) the display panel pad PAD and the display panel pad PAD, and may cover the connection lead LE and the connection lead LE of the driving film 30. The adhesive layer DF may include an adhesive material capable of attaching the display panel 10 to the driving film 30 and may include an insulating material. In other words, the adhesive layer DF may include a material having adhesiveness and insulation properties. Although the disclosure is not limited thereto, the adhesive layer DF may include, for example, at least one of an epoxy resin, an acrylic resin, and a polyester resin.

The conductive balls CB may have, but are not limited to, a spherical shape. In case that the conductive balls CB have a spherical shape, the conductive balls CB may be formed by coating a spherical polymer with at least one metal among nickel (Ni), cobalt (Co), gold (Au), silver (Ag), and copper (Cu). The conductive balls CB may be disposed between the display panel pads PAD and the connection leads LE and may electrically connect the display panel pads PAD with the connection leads LE.

For example, the conductive balls CB may be stacked in the thickness direction (e.g., the third direction DR3) between the display panel pads PAD and the connection leads LE. The conductive balls CB may directly contact each other. Some of the conductive balls CB may directly contact the display panel pads PAD or the connection leads LE. For example, the display panel pads PAD and the connection leads LE may be electrically connected with each other by the conductive balls CB and may directly contact each other. It is, however, to be understood that the disclosure is not limited thereto. A single conductive ball CB is disposed between the display panel pads PAD and the connection leads LE in the thickness direction (the third direction DR3) such that one side of the conductive ball CB in the thickness direction (e.g., the third direction DR3) directly contacts the connection leads LE while the other side (or another side) thereof in the thickness direction (the third direction DR3) directly contacts the display panel pads PAD, and thus the display panel pads PAD and the connection leads LE can be physically and/or electrically connected with each other.

Even though the conductive balls CB are disposed between the connection leads LE adjacent to each other and between the display panel pads PAD adjacent to each other, the conductive balls CB may be at least partially spaced apart from one another therebetween, such that the connection leads LE adjacent to each other and the display panel pads PAD adjacent to each other may not be physically and/or electrically connected with each other. Accordingly, the connection leads LE adjacent to each other can be electrically insulated from each other, and display panel pads PAD adjacent to each other can be electrically insulated from each other.

Although not shown in the drawings, the conductive adhesive member ACF may include a stack of multiple layers. In other words, the conductive adhesive member ACF may further include an additional insulating layer on and/or under the adhesive layer DF, in addition to the adhesive layer DF and the conductive balls CB. The additional insulating layer may have insulation properties and adhesiveness. Accordingly, it can improve the adhesion between the adhesive layer DF and the display panel 10 and between the adhesive layer DF and the driving film 30 and can cover and protect the adhesive layer DF and the conductive balls CB.

In the foregoing description, the conductive adhesive member ACF has been described as being an anisotropic conductive film including the conductive balls CB, but the disclosure is not limited thereto. The conductive adhesive member ACF may be an adhesive film not including the conductive balls CB. In this case, the display panel 10 and the driving film 30 may be attached together by using ultrasonic waves.

Although the disclosure is not limited thereto, the dam structure DAM may be disposed more to the outside of the display panel 10 than the conductive adhesive member ACF, and may overlap the conductive adhesive member ACF in the thickness direction (the third direction DR3). In other words, the dam structure DAM may be disposed on the second side of the conductive adhesive member ACF in the second direction DR2. The dam structure DAM may overlap and directly contact the conductive adhesive member ACF.

The dam structure DAM and the display panel pads PAD may be disposed on the same layer. In other words, the dam structure DAM and the display panel pads PAD may be disposed right (or directly) on the same layer. For example, in case that the display panel pads PAD are formed as the data conductive layer 160 (see FIG. 9), the display panel pads PAD and the dam structure DAM are formed right on the third insulating layer IL3 (see FIG. 9).

In this case, the dam structure DAM may include a stack of three layers. The layers of the stack may include the same materials as the fourth insulating layer IL4 (see FIG. 9), as a pixel-defining layer PDL (see FIG. 9), and as a spacer SC (see FIG. 9). In other words, the layers of the stack may be formed as parts of the fourth insulating layer IL4 (see FIG. 9), the pixel-defining layer PDL (see FIG. 9), and the spacer SC (see FIG. 9), respectively. The stack of three layers may be formed in substantially the same pattern in a plan view. The side surfaces of the layers may be aligned with one another, or the side surfaces of at least one of the layers may protrude outward from the side surfaces of the other layers. For example, there may be level differences (or height differences) among the layers of the stack.

However, the configuration and the layers of the dam structure DAM are not limited thereto. The dam structure DAM may be formed as a part of at least one of first to fourth insulating layers IL1 to IL4 (see FIG. 9), a pixel-defining layer PDL (see FIG. 9), and a spacer SC (see FIG. 9) depending on the layers disposed therein.

The dam structure DAM may have an island shape in a plan view. In other words, the dam structure DAM may be separated from and spaced apart from an insulating layer (an inorganic film and an organic film) of the display panel 10, and the dam structure DAM and the insulating layer may be disposed on a same layer. For example, in case that the dam structure DAM is disposed on the third insulating layer IL3 (see FIG. 9), the dam structure DAM may have a stack of multiple layers and may be separated and spaced apart from the fourth insulating layer IL4 (see FIG. 9), the pixel-defining layer PDL (see FIG. 9), and the spacer SC (see FIG. 9).

Although the disclosure is not limited thereto, the thickness TH of the dam structure DAM may be, for example, in a range of about 0.1 μm to about 10 μm, or may be in a range of about 1 μm to about 5 μm. In case that the thickness TH of the dam structure DAM lies within the above ranges, the movement of the conductive adhesive member ACF can be controlled efficiently, and the driving film 30 and the display panel 10 can be attached together reliably even if the dam structure DAM protrudes from the display panel 10 toward the driving film 30.

As the dam structure DAM is disposed more to the outside of the display panel 10 than the conductive adhesive member ACF, the dam structure DAM can control the movement of the conductive adhesive member ACF. In other words, even if pressure is applied to the conductive adhesive member ACF during the process of attaching the display panel 10 and the driving film 30 together, the dam structure DAM can suppress or prevent the conductive adhesive member ACF (or adhesive layer DF) from overflowing to the outside of the display panel 1. That is to say, by virtue of the dam structure DAM disposed more to the outside of the display panel 10 than the conductive adhesive member ACF, it is possible to suppress or prevent the conductive adhesive member ACF (or the adhesive layer DF) from overflowing to the outside of the sub-region SR of the display panel 10.

By virtue of the dam structure DAM, it is possible to suppress or prevent the conductive adhesive member ACF (or the adhesive layer DF) from overflowing out of the sub-region SR of the display panel 10, and thus the conductive adhesive member ACF (or the adhesive layer DF) does not directly contact the cover film CF or the adhesive member PSA. Accordingly, it is possible to suppress or prevent the ionic components contained in the cover film CF from moving to the conductive adhesive member ACF (or the adhesive layer DF). Moreover, even if the ionic components contained in the cover film CF move to the adhesive member PSA, it is possible to suppress or prevent the ionic components from moving to the conductive adhesive member ACF (or adhesive layer DF).

In this case, it is possible to suppress or prevent corrosion of the surfaces of the connection leads LE and the display panel pads PAD due to the ionic components. As a result, it is possible to suppress or prevent a contact failure between the connection leads LE and the display panel pads PAD due to the corrosion, and thus the reliability of the display device 1 can be improved.

The ionic components contained in the cover film CF may include, but is not limited to, sulfur (S), fluorine (F), etc. In case that the ionic components contained in the cover film CF includes sulfur (S), fluorine (F), etc., oxidation may take place on the surfaces of the connection leads LE and the display panel pads PAD. It is, however, to be understood that the disclosure is not limited thereto.

The entire areas of the connection leads LE and the third signal lines L3 are covered by the conductive adhesive member ACF and the protection member 320 and thus can be protected from outside air and moisture. In other words, portions of the connection leads LE and the third signal lines L3 not covered (or overlapped) by the conductive adhesive member ACF may be protected by being covered by the protection member 320. Accordingly, the connection leads LE and the third signal lines L3 include no portions exposed to the outside, and no additional moisture-proof member for covering the exposed portions of the connection leads LE and the third signal lines L3 is required.

If the moisture-proof member is disposed, the moisture-proof member may directly contact the conductive adhesive member ACF (or adhesive layer DF) and may directly contact at least one of the cover film CF and the adhesive member PSA. In this case, although the conductive adhesive member ACF (or adhesive layer DF) does not directly contact the cover film CF or the adhesive member PSA, the ionic components of the cover film CF may move to the conductive adhesive member ACF (or adhesive layer DF) through the moisture-proof member. The protection member 320 is disposed across the non-overlapping area NOA and the overlapping area OA and covers (or overlaps) the entire areas of the connection leads LE and the third signal lines L3, and thus a moisture-proof member may be removed. Accordingly, it is possible to prevent the movement of ionic components of the cover film CF through the moisture-proof member.

Removal of the moisture-proof member enables a process of forming the moisture-proof member to be omitted, and thus the process may be simplified, and the process costs may be reduced. In addition, it is possible to avoid or prevent defects caused in case that the moisture-proof member, etc., is applied improperly, and thus the reliability of the display device 1 can be improved.

The dam structure DAM and the protection member 320 may be attached together by the conductive adhesive member ACF where the dam structure DAM and the protection member 320 overlap each other. In other words, in case that the dam structure DAM and the protection member 320 are spaced apart from each other, the conductive adhesive member ACF may be interposed between the dam structure DAM and the protection member 320. Specifically, the adhesive layer DF of the conductive adhesive member ACF may be interposed between the dam structure DAM and the protection member 320. As a result, the dam structure DAM and the protection member 320 may be attached together.

As the conductive adhesive member ACF is interposed between the dam structure DAM and the protection member 320, it is possible to block outside air, moisture, etc., permeating from the second side of the sub-region SR of the display panel 10 in the second direction DR2. Specifically, even if the dam structure DAM and the protection member 320 include organic films, they may be cured and thus can block outside air, moisture, etc., effectively. The conductive adhesive member ACF disposed on the outermost position of the sub-region SR of the display panel 10 is interposed between the dam structure DAM and the protection member 320, so that the thickness of the conductive adhesive member ACF can be reduced. Accordingly, the path through which outside air, moisture, etc. can permeate into the conductive adhesive member ACF is reduced, so that it is possible to effectively suppress or prevent the permeation of outside air, moisture, etc.

In case that the conductive balls CB have a spherical shape, a gap GP between the dam structure DAM and the protection member 320 may be smaller than the diameter R of the conductive balls CB. Therefore, the conductive balls CB cannot move to an outer side of the dam structure DAM and may be disposed on an inner side of the dam structure DAM. In other words, the conductive balls CB may be disposed only on one side (or first side) of the dam structure DAM in the second direction DR2 while not on the opposite side (or second side) in the second direction DR2. By adjusting the gap GP between the dam structure DAM and the protection member 320, it is possible to control the movement of the conductive balls CB, and in turn, the movement of the conductive adhesive member ACF.

The conductive balls CB may not be disposed between the dam structure DAM and the protection member 320 where they overlap each other. It is, however, to be understood that the disclosure is not limited thereto. Although the disclosure is not limited thereto, the gap GP between the dam structure DAM and the protection member 320 may be, for example, in a range of about 1 μm to about 4 μm, in a range of about 2 μm to about 3 μm, or about 2.2 μm. The diameter R of the conductive balls CB may be, for example, in a range of about 2 μm to about 5 μm, or in a range of about 3 μm to about 4 μm.

In case that the gap GP between the dam structure DAM and the protection member 320 and the diameter R of the conductive balls CB lie within the above ranges, it is possible to control the movement of the conductive balls CB. Even in case that the conductive balls CB between the connection leads LE and the display panel pads PAD overlapping each other electrically connect them and are disposed between adjacent ones of the connection leads LE and between adjacent ones of the display panel pads PAD, the adjacent ones of the connection leads LE can be electrically insulated from each other, and the adjacent ones of the display panel pads PAD can be electrically insulated from each other.

Hereinafter, a stack structure of the display panel 10 according to an embodiment will be described with reference to FIG. 9.

Figure 9:
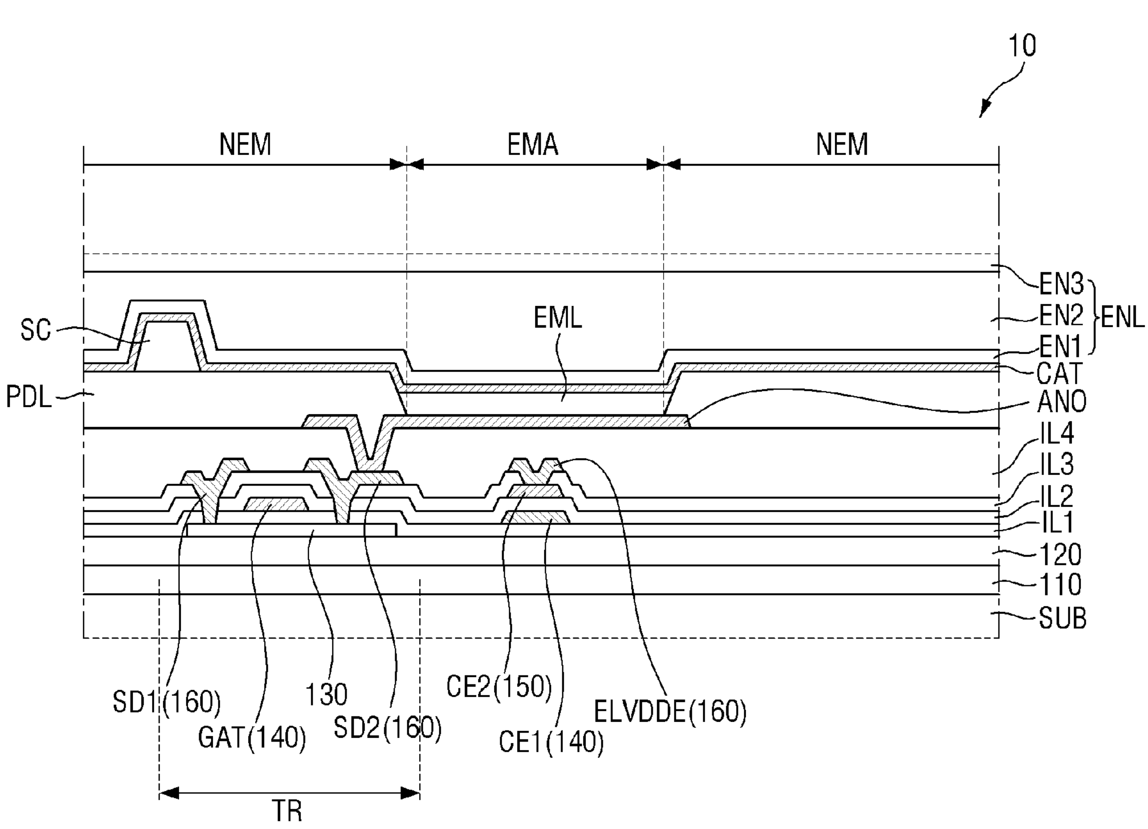
FIG. 9 is a schematic cross-sectional view of a display panel according to an embodiment of the disclosure.

FIG. 9 is a schematic cross-sectional view of a display panel according to an embodiment. FIG. 9 illustrates a cross-sectional structure of a pixel of the display panel 10.

Referring to FIG. 9, the display panel 10 according to an embodiment may include pixels. Each of the pixels may include at least one thin-film transistor TR. The display panel 10 may include a substrate SUB, a barrier layer 110, a buffer layer 120, a semiconductor layer 130, a first insulating layer ILL a first gate conductive layer 140, a second insulating layer IL2, a second gate conductive layer 150, a third insulating layer IL3, a data conductive layer 160, a fourth insulating layer IL4, an anode electrode ANO, a pixel-defining layer PDL including an opening exposing the anode electrode ANO, an emissive layer EML disposed in the opening of the pixel-defining layer PDL, a cathode electrode CAT disposed on the emissive layer EML and the pixel-defining layer PDL, and an encapsulation layer ENL disposed on the cathode electrode CAT. Each of the layers described above may be made up of a single film, or a stack of multiple films. Other layers may be further disposed between the layers.

The substrate SUB supports the layers disposed thereon. The substrate SUB may be made of an insulating material such as a polymer resin, or may be made of an inorganic material such as glass and quartz. It is, however, to be understood that the disclosure is not limited thereto. The substrate SUB may be a transparent plate or a transparent film.

The substrate SUB may be, but is not limited to, a flexible substrate that can be bent, folded, or rolled, but the disclosure is not limited thereto. The substrate SUB may be a rigid substrate.

The barrier layer 110 is disposed on the substrate SUB. The barrier layer 110 can prevent impurity ions from diffusing, can prevent permeation of moisture or outside air, and can provide a flat surface. The barrier layer 110 may include at least one of silicon oxide ($SiO_x$), silicon nitride ($SiN_x$), and silicon oxynitride ($SiO_xN_y$). It is, however, to be understood that the disclosure is not limited thereto. The barrier layer 110 may be removed depending on the type of the substrate SUB or process conditions.

The buffer layer 120 is disposed on the barrier layer 110. The buffer layer 120 can prevent impurity ions from diffusing, can prevent permeation of moisture or outside air, and can provide a flat surface. The buffer layer 120 can enhance the adhesion to the semiconductor layer 130 thereon. The buffer layer 120 may include silicon nitride ($SiN_x$), silicon oxide ($SiO_x$), or silicon oxynitride ($SiO_xN_y$).

The semiconductor layer 130 is disposed on the buffer layer 120. The semiconductor layer 130 forms a channel of the thin-film transistor TR of the pixel PX (see FIG. 3). The semiconductor layer 130 may include polycrystalline silicon. It is, however, to be understood that the disclosure is not limited thereto. The semiconductor layer 130 may include at least one of monocrystalline silicon, low-temperature polycrystalline silicon, amorphous silicon, and an oxide semiconductor.

The first insulating layer IL1 is disposed on the semiconductor layer 130. The first insulating layer IL1 may be a first gate insulating film that has a gate insulating function. The first insulating layer IL1 may include at least one of a silicon compound and a metal oxide.

The first gate conductive layer 140 is disposed on the first insulating layer ILL The first gate conductive layer 140 may include a gate electrode GAT of the thin-film transistor TR of the pixel, a scan line electrically connected thereto, and a first electrode CE1 of a storage capacitor.

The first gate conductive layer 140 may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A second insulating layer IL2 may be disposed on the first gate conductive layer 140. The second insulating layer IL2 may be an interlayer dielectric layer or a second gate insulating layer. The second insulating layer IL2 may include an inorganic insulating material such as silicon oxide, silicon nitride, silicon oxynitride, hafnium oxide, aluminum oxide, titanium oxide, tantalum oxide, and zinc oxide.

The second gate conductive layer 150 is disposed on the second insulating layer IL2. The second gate conductive layer 150 may include a second electrode CE2 of the storage capacitor. The second gate conductive layer 150 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 150 and the first gate conductive layer 140 may be made of (or include), but is not limited to, the same material.

The third insulating layer IL3 is disposed on the second gate conductive layer 150. The third insulating layer IL3 may be an interlayer dielectric film. The third insulating layer IL3 may include an inorganic insulating material such as silicon oxide, silicon nitride, silicon oxynitride, hafnium oxide, aluminum oxide, titanium oxide, tantalum oxide, and zinc oxide.

The data conductive layer 160 is disposed on the third insulating layer IL3. The data conductive layer 160 may include a first electrode SD1 and a second electrode SD2 of a thin-film transistor TR of a pixel, and a first voltage line ELVDDE of the display panel. The first electrode SD1 and the second electrode SD2 of the thin-film transistor TR may be electrically connected to a source region and a drain region of the semiconductor layer 130, respectively, through contact holes passing through the third insulating layer IL3, the second insulating layer IL2, and the first insulating layer ILL The first supply voltage line ELVDDE may be electrically connected to the second electrode CE2 of the storage capacitor through a contact hole penetrating through the third insulating layer IL3.

The data conductive layer 160 may include at least one selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The data conductive layer 160 may be made up of a single layer or multiple layers. For example, the data conductive layer 160 may have a stack structure of Ti/Al/Ti, Mo/Al/Mo, Mo/AlGe/Mo, and Ti/Cu.

The fourth insulating layer IL4 is disposed on the data conductive layer 160. The fourth insulating layer IL4 covers the data conductive layer 160. The fourth insulating layer IL4 may be a via layer. The fourth insulating layer IL4 may include an organic insulating material. In case that the fourth insulating layer IL4 includes an organic material, it may have a generally flat upper surface despite the level differences thereunder.

The anode electrode ANO is disposed on the fourth insulating layer IL4. The anode electrode ANO may be a pixel electrode disposed in each of the pixels. The anode electrode ANO may be electrically connected to the second electrode SD2 of the thin-film transistor TR through a contact hole penetrating through the fourth insulating layer IL4. The anode electrode ANO may at least partially overlap the emission area EMA of the pixel.

The anode electrode ANO may have, but is not limited to, a stack structure of a material layer having a high work function such as indium tin oxide (ITO), indium zinc oxide (IZO), zinc oxide (ZnO), and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof. A layer having a higher work function may be disposed on a higher layer than a reflective material layer so that it may be closer to the emissive layer EML. The anode electrode ANO may have, but is not limited to, a multilayer structure of ITO/Mg, ITO/MgF, ITO/Ag, and ITO/Ag/ITO.

The pixel-defining layer PDL may be disposed on the anode electrode ANO. The pixel-defining layer PDL may be disposed over the anode electrode ANO and may include the opening exposing the anode electrode ANO. The emission area EMA and a non-emission area NEM may be distinguished by the pixel-defining layer PDL and the opening thereof. The pixel-defining layer PDL may include an organic insulating material. It is, however, to be understood that the disclosure is not limited thereto. The pixel-defining layer PDL may also include an inorganic material.

A spacer SC may be disposed on the pixel-defining layer PDL. The spacer SC may maintain a gap with elements disposed thereabove. The spacer SC may include an organic insulating material like the pixel-defining layer PDL.

The emissive layer EML may be disposed on the anode electrode ANO exposed by the pixel-defining layer PDL. The emissive layer EML may include an organic material layer. The organic material layer of the emission layer may include an organic emission layer and may further include a hole injecting/transporting layer and/or an electron injecting/transporting layer.

The cathode electrode CAT may be disposed on the emissive layer EML. The cathode electrode CAT may be a common electrode disposed across the pixels. The anode electrode ANO, the emissive layer EML, and the cathode electrode CAT may form an organic light-emitting element.

The cathode electrode CAT may include a material layer having a small work function such as Li, Ca, LiF/Ca, LiF/Al, Al, Mg, Ag, Pt, Pd, Ni, Au, Nd, Ir, Cr, BaF, and Ba, or a compound or mixture thereof (e.g., a mixture of Ag and Mg). The cathode electrode CAT may further include a transparent metal oxide layer disposed on the material layer having a small work function.

An encapsulation layer ENL including a first inorganic film EN1, a first organic film EN2, and a second inorganic film EN3 is disposed on the cathode electrode CAT. The first inorganic film EN1 and the second inorganic film EN3 may contact each other at the end of the encapsulation layer ENL. The first organic film EN2 may be sealed by the first inorganic film EN1 and the second inorganic film EN3.

Each of the first inorganic film EN1 and the second inorganic film EN3 may include silicon nitride, silicon oxide, silicon oxynitride, or the like. The first organic film EN2 may include an organic insulating material.

Hereinafter, other embodiments will be described. In the following description, the same or similar elements will be denoted by the same or similar reference numerals, and repetitive descriptions thereof will be omitted or briefly described. Descriptions will be made focusing on differences from the above embodiment.

Figure 10:
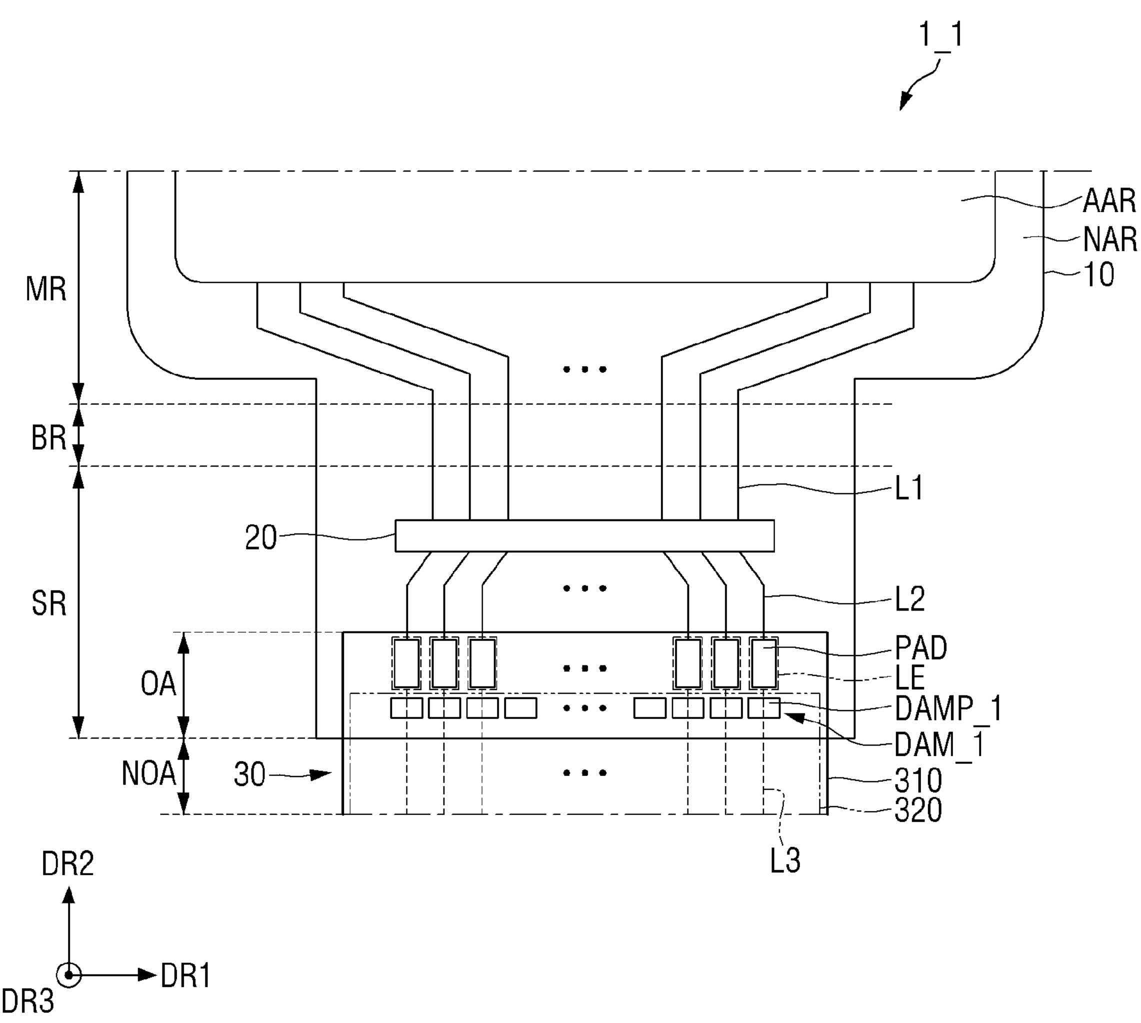
FIG. 10 is a schematic plan view illustrating a layout of a display panel and a driving film of a display device according to another embodiment.

FIG. 10 is a schematic plan view illustrating a layout of a display panel and a driving film of a display device according to another embodiment. FIG. 10 illustrates the periphery of the sub-region SR of the display panel 10 in case that it is not bent.

The embodiment of FIG. 10 is different from the embodiment of FIG. 4 at least in that a dam structure DAM_1 of a display device 1_1 may be patterned. In other words, the dam structure DAM_1 may include dam patterns DAMP_1 spaced apart from one another. The dam patterns DAMP_1 may be spaced apart from one another and arranged in the first direction DR1. The dam patterns DAMP_1 may be aligned with the display panel pads PAD in the second direction DR2, respectively, or may be arranged so that they are staggered with the display panel pads PAD. It is, however, to be understood that the disclosure is not limited thereto. The arrangement of the dam patterns DAMP_1 may be altered in a variety of ways.

Even in this instance, as the dam structure DAM_1 is disposed, the movement of the conductive adhesive member ACF (see FIG. 6) can be controlled. As the dam structure DAM_1 is implemented as the dam patterns DAMP_1, the movement of the conductive adhesive member ACF (see FIG. 6) depending on whether the display panel pads PAD are disposed can be individually controlled. In this manner, it is possible to more efficiently control the movement of the conductive adhesive member ACF (see FIG. 6). In other words, the conductive adhesive member ACF (see FIG. 6) may have different movements between a region where the display panel pads PAD are disposed and a region where the display panel pads PAD are not disposed. Accordingly, it is possible to control them by using the pattern of the dam patterns DAMP_1.

Figure 11:
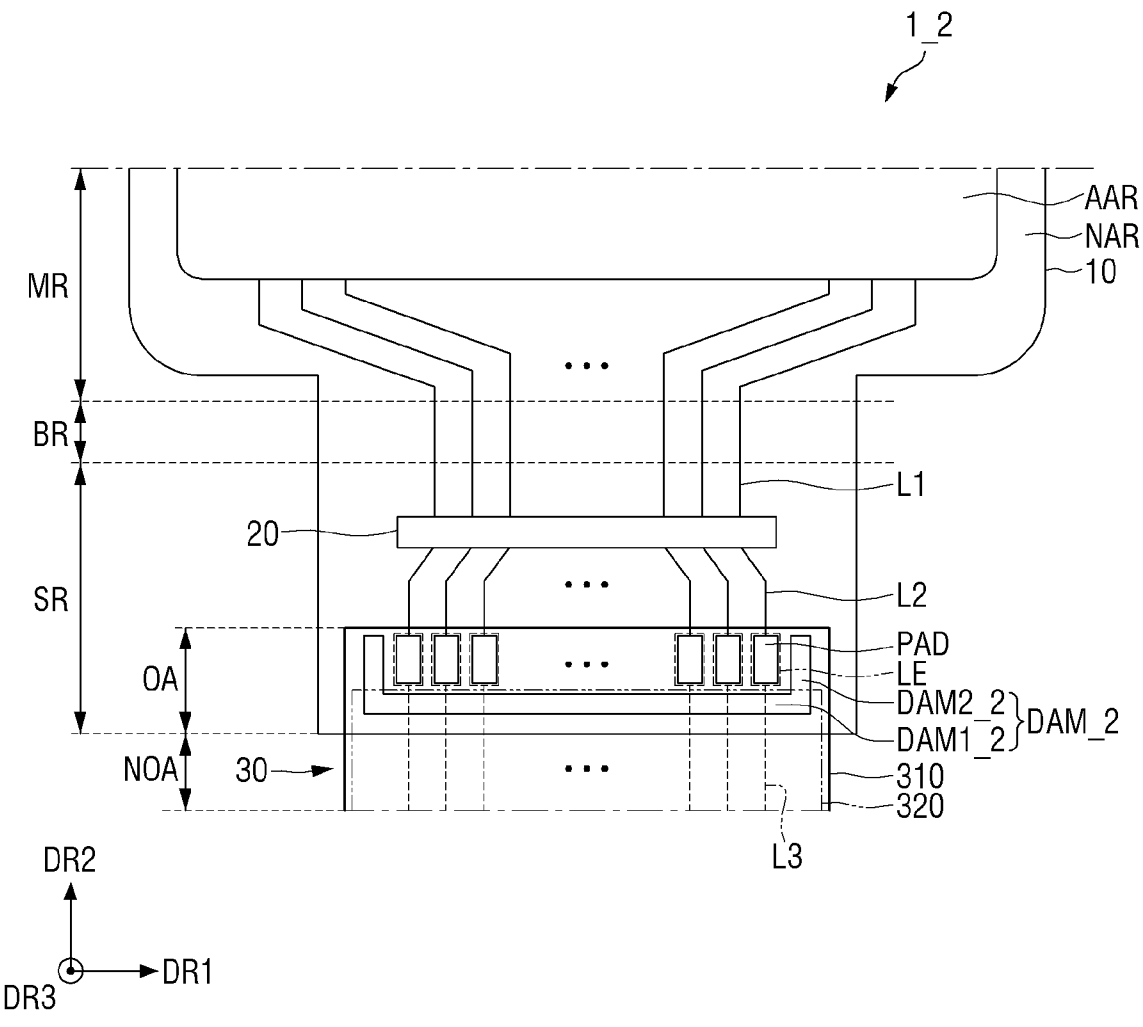
FIG. 11 is a schematic plan view illustrating a layout of a display panel and a driving film of a display device according to yet another embodiment.

FIG. 11 is a schematic plan view illustrating the layout of a display panel and a driving film of a display device according to yet another embodiment. FIG. 11 illustrates the periphery of the sub-region SR of the display panel 10 in case that it is not bent.

The embodiment of FIG. 11 is different from the embodiment of FIG. 4 at least in that a dam structure DAM_2 of a display device 1_2 may be disposed on the first side and the second side in the first direction DR1 as well as the second side in the second direction DR2.

The dam structure DAM_2 may further include a first area DMA1_2 extended in the first direction DR1 and second dam areas DAM2_2 extended from a first side and a second side of the first dam area DAM1_2 in the first direction DR1, respectively, toward the first side in the second direction DR2. The first dam area DMA1_2 may be disposed on the second side of the display panel pads PAD in the second direction DR2, and the second dam areas DAM2_2 may be disposed on the first side and the second side of the display panel pads PAD in the first direction DR1, respectively.

In this instance, as the dam structure DAM_2 is disposed not only on the second side of the display panel pads PAD in the second direction DR2 but also on the first side and the second side thereof in the first direction DR1, the movement of the conductive adhesive member ACF (see FIG. 6) can be controlled on the second side in the second direction DR2 and on the first and second sides in the first direction DR1. Accordingly, the reliability of the display device 1 can be further improved.

Figure 12:
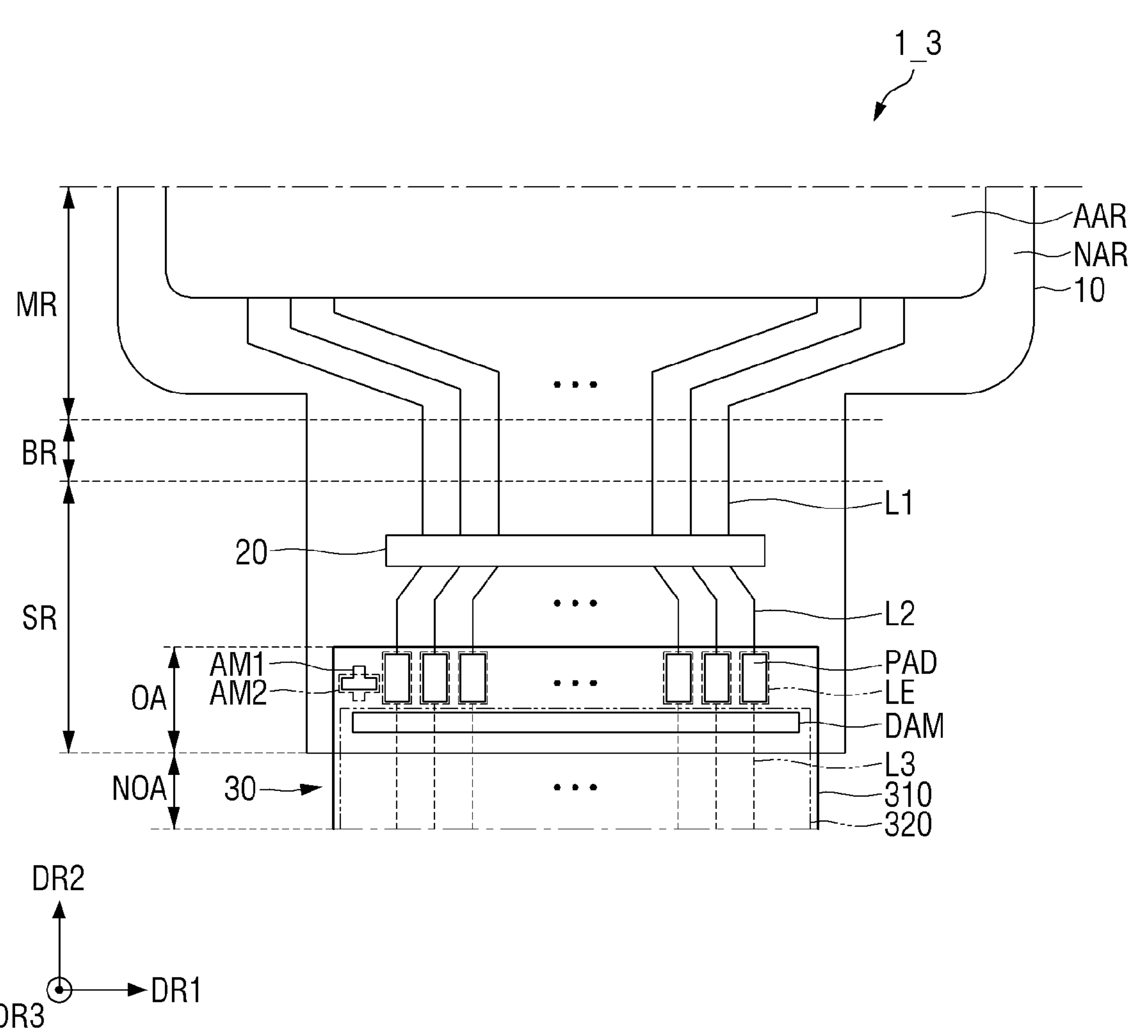
FIG. 12 is a schematic plan view illustrating a layout of a display panel and a driving film of a display device according to yet another embodiment.
Figure 13:
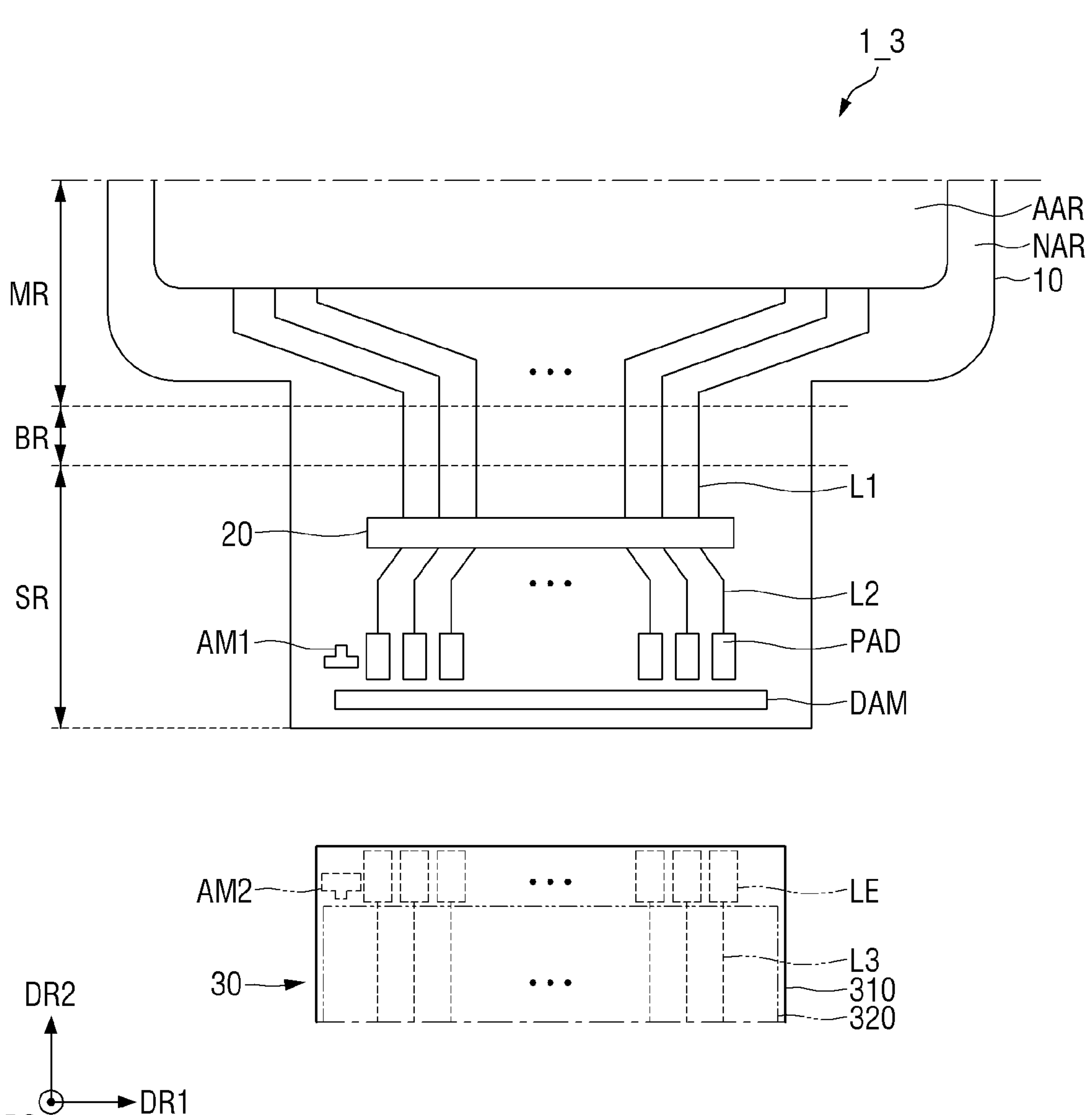
FIG. 13 is a schematic plan view illustrating the display panel and the driving film of FIG. 12, which are separated from each other.

FIG. 12 is a schematic plan view illustrating the layout of a display panel and a driving film of a display device according to yet another embodiment. FIG. 13 is a schematic view illustrating the display panel and the driving film of FIG. 12, which are separated from each other. FIGS. 12 and 13 illustrate the periphery of the sub-region SR of the display panel 10 that is not bent.

The embodiments of FIGS. 12 and 13 are different from the embodiment of FIGS. 4 and 5 at least in that a display device 1_3 may further include a first alignment mark AM1 and a second alignment mark AM2.

Specifically, the display device 1_3 may further include the first alignment mark AM1 and the second alignment mark AM2. The first alignment mark AM1 may be disposed on the display panel 10, and the first alignment mark AM1 may be disposed on the upper surface of the display panel 10. The second alignment mark AM2 may be disposed on the driving film 30, and specifically, the second alignment mark AM2 may be disposed on the rear surface of the driving film 30. The second alignment mark AM2 may be disposed on the rear surface of the driving film board 310 and may not overlap the protection member 320, but the disclosure is not limited thereto.

The first alignment mark AM1 may be disposed on the second side of the display panel pads PAD in the first direction DR1, and the second alignment mark AM2 may be disposed on a second side of the connection leads LE in the first direction DR1. It is, however, to be understood that the disclosure is not limited thereto. The first alignment mark AM1 may be extended in the first direction DR1 and may include a portion protruding from the center thereof to the first side in the second direction DR2. In other words, the first alignment mark AM1 may have an inverted T-shape in a plan view. The second alignment mark AM2 may be extended in the first direction DR1 and may include a portion protruding from the center thereof to the second side in the second direction DR2. In other words, the second alignment mark AM2 may have a T-shape in a plan view. It is, however, to be understood that the disclosure is not limited thereto. The first alignment mark AM1 and the second alignment mark AM2 may have different shapes in a plan view.

The first alignment mark AM1 and the second alignment mark AM2 may overlap each other in the thickness direction (the third direction DR3). The first alignment mark AM1 and the second alignment mark AM2 can indicate locations during a process of bonding the driving film 30 to the display panel 10. In other words, the first alignment mark AM1 along with the second alignment mark AM2 can be used to align the display panel 10 with the driving film 30. The first alignment mark AM1 and the display panel pads PAD may have the same stack structure, but the disclosure is not limited thereto.

In this instance, the arrangement of the dam structure DAM enables the movement of the conductive adhesive member ACF (see FIG. 6) to be controlled despite the alignment of the display panel 10 and the driving film 30. In case that the display panel 10 and the driving film 30 are aligned with each other by the first alignment mark AM1 and the second alignment mark AM2, the protection member 320 of the driving film 30 may be disposed outward of the outer side of the display panel 10 than a desired position during the alignment process. For example, during the alignment process, the protection member 320 may be moved to the second side in the second direction DR2 and may be located on the second side of the dam structure DAM in the second direction DR2.

Even if the protection member 320 is disposed outward of the outer side of the display panel 10 than a desired position, it is possible to control the movement of the conductive adhesive member ACF (see FIG. 6) by the dam structure DAM. Accordingly, the first side of the dam structure DAM in the second direction DR2 can be filled with the conductive adhesive member ACF (see FIG. 6), and the connection leads LE and the third signal lines L3 can be covered by the conductive adhesive member ACF (see FIG. 6). For example, the arrangement of the dam structure DAM enables the movement of the conductive adhesive member ACF (see FIG. 6) to be controlled regardless of the position of the protection member 320 according to the alignment, and it is possible to protect the connection leads LE and the third signal lines L3.

Figure 14:
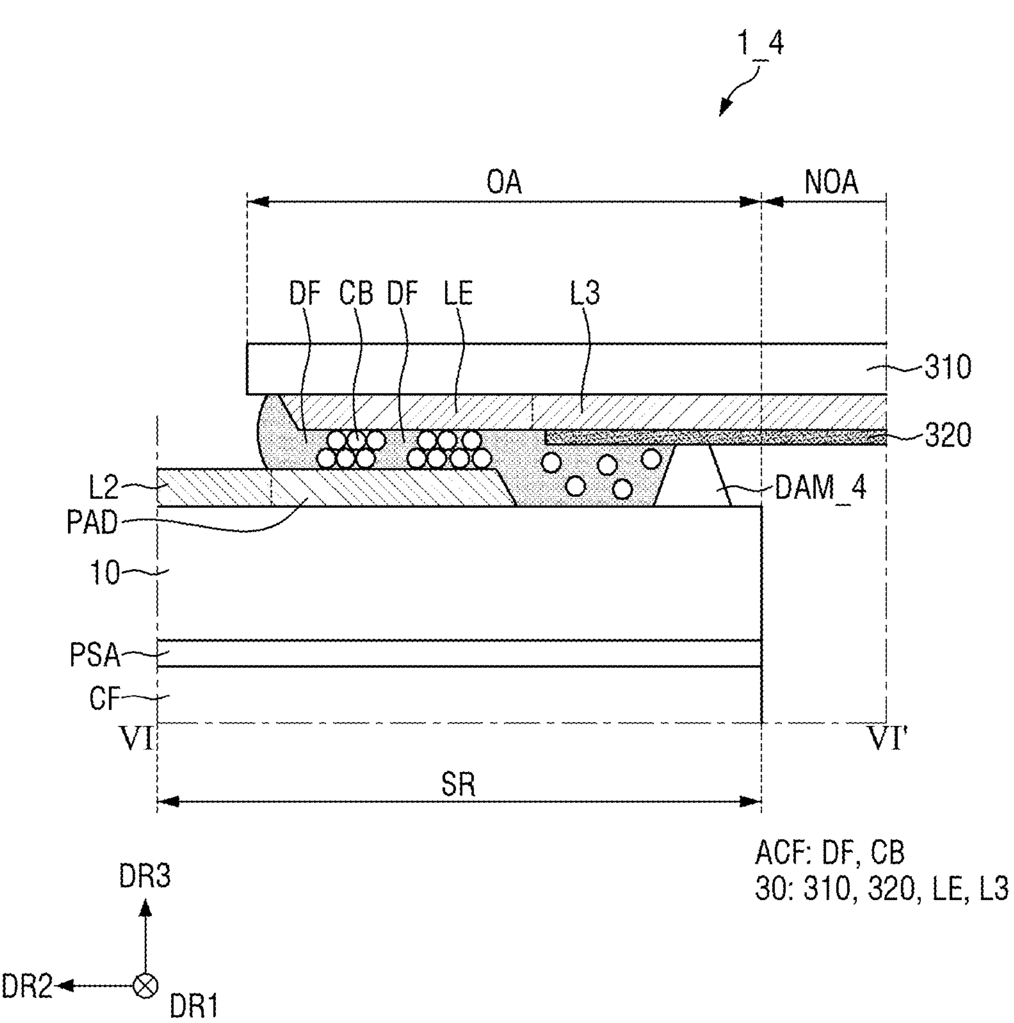
FIG. 14 is a schematic cross-sectional view taken along line VI-VI' of FIG. 4 according to another embodiment.

FIG. 14 is a schematic cross-sectional view taken along line VI-VI' according to another embodiment. FIG. 14 illustrates the periphery of the sub-region SR of the display panel 10 that is not bent.

The embodiment of FIG. 14 is different from the embodiment of FIG. 6 at least in that a dam structure DAM_4 of a display device 1_4 at least partially contacts a protection member 320 of a driving film 30. The conductive adhesive member ACF may not be interposed between the dam structure DAM_4 and the protection member 320 directly contacting each other. In this case, the conductive adhesive member ACF may be disposed on a first side of the dam structure DAM_4 in the second direction DR2 while not on a second side of the dam structure DAM_4 in the second direction DR2.

Even in this instance, the arrangement of the dam structure DAM_4 enables the movement of the conductive adhesive member ACF to be controlled, and as the dam structure DAM_4 and the protection member 320 directly contact each other, the movement of the conductive adhesive member ACF can be controlled more efficiently.

Figure 15:
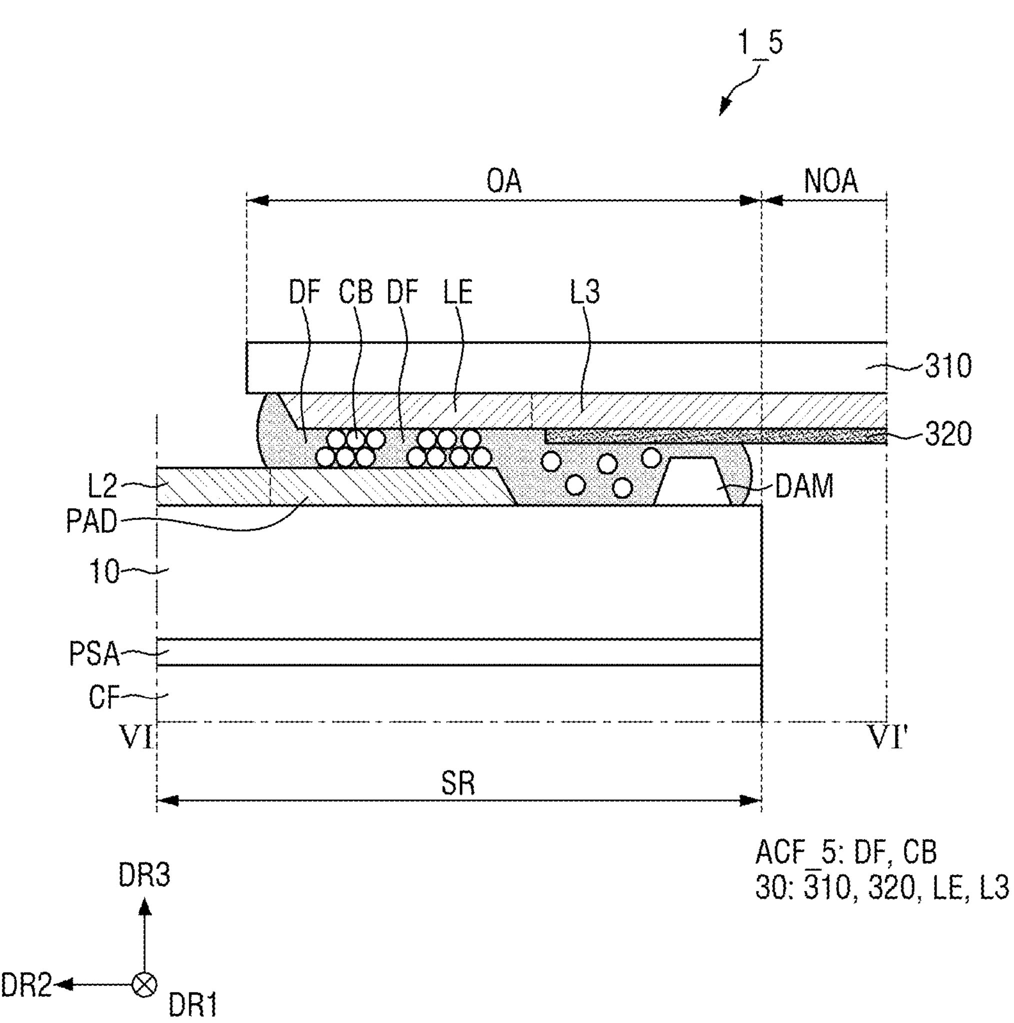
FIG. 15 is a schematic cross-sectional view taken along line VI-VI' of FIG. 4 according to another embodiment.

FIG. 15 is a schematic cross-sectional view taken along line VI-VI' of FIG. 4 according to another embodiment. FIG. 15 illustrates the periphery of the sub-region SR of the display panel 10 in case that it is not bent.

The embodiment of FIG. 15 is different from the embodiment of FIG. 6 at least in that at least a part of a conductive adhesive member ACF_5 of a display device 1_5 may be disposed on the second side of a dam structure DAM in the second direction DR2. The conductive adhesive member ACF_5 may be disposed not only on the first side of the dam structure DAM in the second direction DR2 but also on the second side in the second direction DR2. In this case, the conductive adhesive member ACF_5 may cover (or overlap) the entire area of the dam structure DAM and may overlap the entire area of the dam structure DAM.

Even in this instance, as the dam structure DAM is disposed, the movement of the conductive adhesive member ACF_5 can be controlled. Even if the conductive adhesive member ACF_5 overflows from the first side of the dam structure DAM to the second side in the second direction DR2, the amount of the conductive adhesive member ACF_5 can be reduced by the dam structure DAM, so that it is possible to prevent the conductive adhesive member ACF_5 from directly contacting a cover film CF and an adhesive member PSA.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:

a display panel comprising at least one display panel pad and a dam structure;

a driving film attached to the display panel, the driving film comprising:

a driving film board;

a connection lead disposed on a rear surface of the driving film board and facing the at least one display panel pad;

a first signal line electrically connected to the connection lead; and a protection member overlapping at least one of the connection lead and the first signal line; and a conductive adhesive member disposed between the display panel and the driving film and electrically connecting the at least one display panel pad with the connection lead, wherein the at least one display panel pad and the dam structure are disposed on an upper surface of the display panel, the dam structure is disposed more to an outside of the display panel than the at least one display panel pad, the protection member of the driving film overlaps the dam structure in a thickness direction of the display device, and the conductive adhesive member contacts the protection member and at least a portion of the dam structure, and wherein the conductive adhesive member contacts a first sidewall and at least a portion of an upper surface of the dam structure and does not contact a second sidewall facing the first sidewall of the dam structure.

2. The display device of claim 1, wherein the display panel comprises:

a main region;

a bending region extended from an end of the main region and bendable in a direction; and a sub-region extended from an end of the bending region and overlapping the main region, the at least one display panel pad and the dam structure are disposed in the sub-region, and the driving film is attached to the sub-region.

3. The display device of claim 2, wherein the driving film comprises:

an overlapping area that overlaps the sub-region of the display panel; and a non-overlapping area that does not overlap the sub-region of the display panel, and the protection member of the driving film is disposed across the overlapping area and the non-overlapping area.

4. The display device of claim 3, wherein the connection lead and the first signal line overlap at least one of the protection member and the conductive adhesive member over the entire area.

5. The display device of claim 1, wherein the dam structure has an island shape in a plan view.

6. The display device of claim 5, wherein the dam structure and the at least one display panel pad are disposed on a same layer and are comprised of different materials.

7. The display device of claim 1, wherein the dam structure has a thickness in a range of about 0.1 μm to about 10 μm.

8. The display device of claim 1, wherein the conductive adhesive member is at least partially disposed between the dam structure and the protection member.

9. The display device of claim 8, wherein the conductive adhesive member is a conductive anisotropic film comprising an adhesive layer and conductive balls.

10. The display device of claim 9, wherein the dam structure and the protection member are spaced apart from each other in the thickness direction of the display device, and a diameter of the conductive balls is greater than a distance between the dam structure and the protection member.

11. The display device of claim 1, wherein the at least one display panel pad comprises a plurality of display panel pads, the dam structure comprises a pattern of dams spaced apart from one another, and the plurality of display panel pads and the dams of the pattern are arranged in a first direction.

12. The display device of claim 11, wherein the at least one display panel pad is aligned with the dams of the pattern, respectively, in a second direction intersecting the first direction.

13. The display device of claim 1, wherein the dam structure comprises:

a first dam area extended in a first direction and located on a side of the at least one display panel pad in a second direction; and a second dam area extended in the second direction from at least one of an end and another end of the first dam area in the first direction and located on at least of a side and another side of the at least one display panel pad in the first direction, and the first direction and the second direction intersect each other.

14. The display device of claim 1, wherein the dam structure directly contacts the protection member of the driving film.

15. The display device of claim 1, wherein the dam structure is extended in a first direction, the conductive adhesive member is disposed on a side and another side of the dam structure in a second direction, and the first direction and the second direction intersect each other.

16. The display device of claim 15, wherein the conductive adhesive member overlaps an entire area of the dam structure.

17. The display device of claim 1, further comprising:

a cover film disposed on a rear surface of the display panel; and an adhesive member disposed between the display panel and the cover film.

18. A display device comprising:

a display panel comprising a display panel pad and a dam structure having an island shape in a plan view;

a driving film attached to the display panel, the driving film comprising:

a driving film board;

a connection lead disposed on a rear surface of the driving film board that faces an upper surface of the display panel to face the display panel pad;

a first signal line electrically connected to the connection lead; and a protection member overlapping at least one of the connection lead and the first signal line; and a conductive adhesive member disposed between the display panel and the driving film and electrically connecting the display panel pad with the connection lead, wherein the display panel pad and the dam structure are disposed on the upper surface of the display panel, the dam structure is disposed more to an outside of the display panel than the display panel pad, the dam structure and the display panel pad are comprised of different materials, and the conductive adhesive member contacts the protection member and at least a portion of the dam structure, and wherein the conductive adhesive member contacts a first sidewall and at least a portion of an upper surface of the dam structure and does not contact a second sidewall facing the first sidewall of the dam structure.

19. The display device of claim 18, wherein the protection member of the driving film and the dam structure face and overlap each other in a thickness direction of the display device, and the conductive adhesive member is disposed between the protection member of the driving film and the dam structure in the thickness direction of the display device.

20. The display device of claim 18, wherein the display panel comprises:

a main region;

a bending region extended from an end of the main region and bendable in a direction; and a sub-region extended from an end of the bending region and overlapping the main region, the display panel pad and the dam structure are disposed in the sub-region, and the driving film is attached to the sub-region.

21. An electronic device comprising:

a display device comprising:

a display panel comprising at least one display panel pad and a dam structure;

a driving film attached to the display panel, the driving film comprising:

a driving film board;

a connection lead disposed on a rear surface of the driving film board and facing the at least one display panel pad;

a first signal line electrically connected to the connection lead; and a protection member overlapping at least one of the connection lead and the first signal line; and a conductive adhesive member disposed between the display panel and the driving film and electrically connecting the at least one display panel pad with the connection lead, wherein the at least one display panel pad and the dam structure are disposed on an upper surface of the display panel, the dam structure is disposed more to an outside of the display panel than the at least one display panel pad, the protection member of the driving film overlaps the dam structure in a thickness direction of the display device, the conductive adhesive member is at least partially disposed between the dam structure and the protection member in the thickness direction of the display device, the conductive adhesive member is a conductive anisotropic film comprising an adhesive layer and conductive balls, the dam structure and the protection member are spaced apart from each other in the thickness direction of the display device, and a diameter of the conductive balls is greater than a distance between the dam structure and the protection member.

22. The electronic device of claim 21, wherein the conductive adhesive member is disposed between the protection member and the dam structure in the thickness direction of the display device where the protection member and the dam structure overlap each other in the thickness direction of the display device.

23. The electronic device of claim 21, wherein the dam structure has an island shape in a plan view.

* * * * *